United States Patent
Kamada et al.

(10) Patent No.: US 8,847,283 B2
(45) Date of Patent: Sep. 30, 2014

(54) COMPOUND SEMICONDUCTOR DEVICE AND METHOD OF MANUFACTURING THE SAME

(71) Applicants: Fujitsu Limited, Kawasaki (JP); Fujitsu Semiconductor Limited, Yokohama (JP)

(72) Inventors: Youichi Kamada, Yamato (JP); Kenji Kiuchi, Aizuwakamatsu (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/968,828

(22) Filed: Aug. 16, 2013

(65) Prior Publication Data

US 2014/0092635 A1   Apr. 3, 2014

(30) Foreign Application Priority Data

Sep. 28, 2012  (JP) ................................. 2012-217621

(51) Int. Cl.
| | |
|---|---|
| *H01L 29/66* | (2006.01) |
| *H01L 29/778* | (2006.01) |
| *H02M 1/00* | (2006.01) |
| *H02M 7/04* | (2006.01) |
| *H02M 3/335* | (2006.01) |

(52) U.S. Cl.
CPC ....... *H01L 29/778* (2013.01); *H02M 2001/007* (2013.01); *H01L 29/66462* (2013.01); *H02M 7/04* (2013.01); *H02M 3/33576* (2013.01)
USPC ........................................... 257/194; 438/172

(58) Field of Classification Search
USPC ................... 257/194, 272, 750, 765; 438/172
See application file for complete search history.

(56) References Cited

U.S. PATENT DOCUMENTS 7,821,036 B2 * 10/2010 Ehara ............................. 257/194
2013/0075749 A1 * 3/2013 Kamada .......................... 257/76

FOREIGN PATENT DOCUMENTS

JP       2011-210750 A1    10/2011

\* cited by examiner

*Primary Examiner* — Mark Prenty
(74) *Attorney, Agent, or Firm* — Fish & Richardson P.C.

(57) ABSTRACT

An AlGaN/GaN HEMT includes: a compound semiconductor layer; a source electrode and a drain electrode formed on an upper side of the compound semiconductor layer; and an Al—Si—N layer being a high-resistance layer disposed in a lower portion of at least one of the source electrode and the drain electrode and higher in an electric resistance value than the source electrode and the drain electrode.

21 Claims, 15 Drawing Sheets

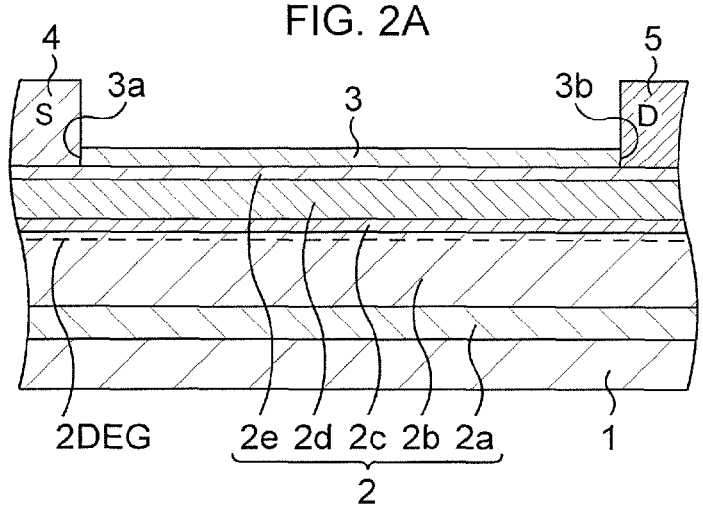
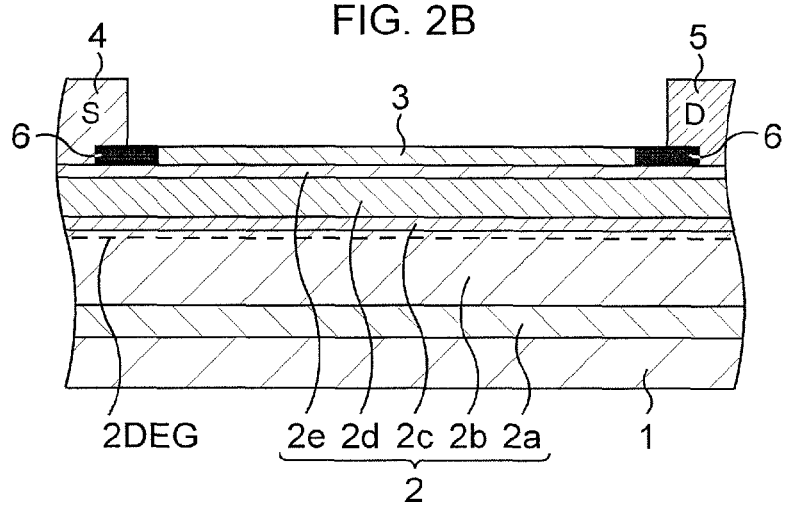
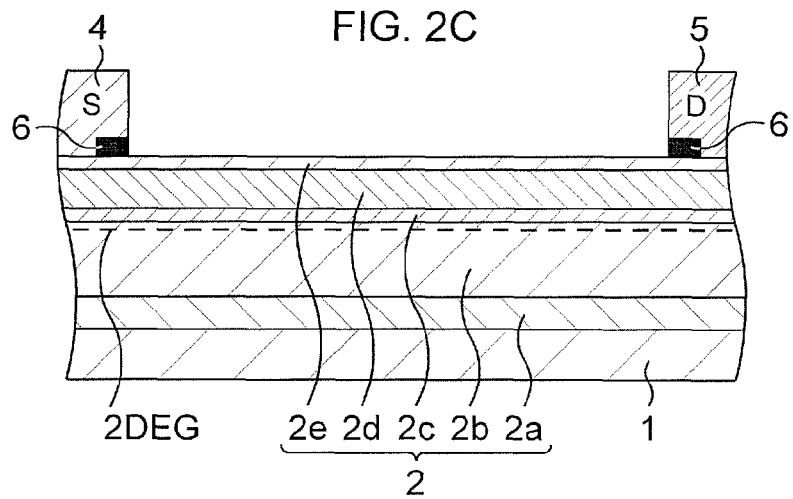

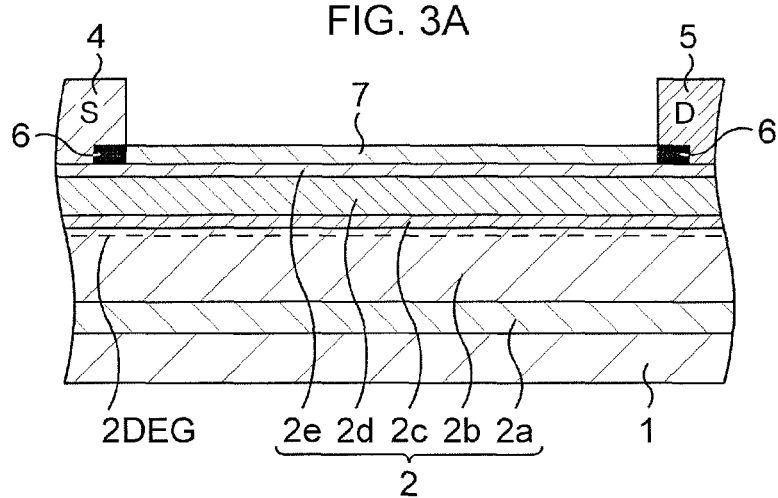
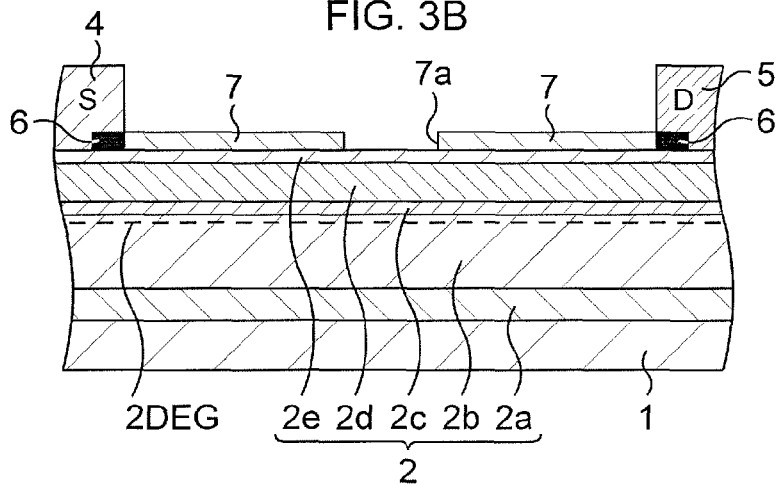
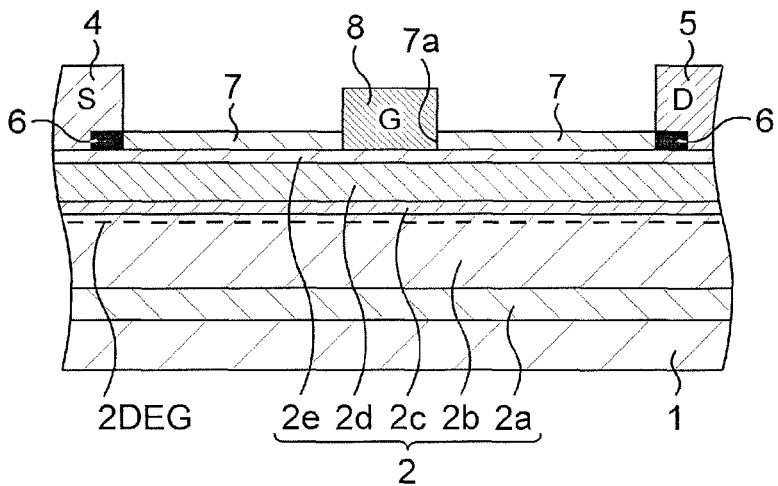

US 8,847,283 B2

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-217621, filed on Sep. 28, 2012, the entire contents of which are incorporated herein by reference.

FIELD

The embodiments discussed herein are directed to a compound semiconductor device and a method of manufacturing the same.

BACKGROUND

Applying nitride semiconductors to high-withstand-voltage and high-power semiconductor devices by utilizing their characteristics such as a high saturation electron velocity and a wide band gap has been considered. For example, GaN being a nitride semiconductor has a band gap of 3.4 eV, which is wider than a band gap of Si (1.1 eV) and a band gap of GaAs (1.4 eV), and has high breakdown electric field intensity. This makes GaN very promising as a material of semiconductor devices for power supply realizing a high voltage operation and a high power.

Many reports have been made on field-effect transistors, in particular, HEMTs (High Electron Mobility Transistors) as semiconductor devices using nitride semiconductors. For example, among GaN-based HEMTs (GaN-HEMTs), an AlGaN/GaN HEMT using GaN as an electron transit layer and using AlGaN as an electron supply layer has been drawing attention. In the AlGaN/GaN HEMT, a distortion ascribable to a difference in lattice constant between GaN and AlGaN occurs in AlGaN. Owing to piezoelectric polarization caused by the distortion and spontaneous polarization of AlGaN, high-concentration two-dimensional electron gas (2DEG) is obtained. Therefore, the AlGaN/GaN HEMT is expected as a high-efficiency switch element or a high-withstand-voltage power device for electric vehicles and the like.

[Patent Document 1] Japanese Laid-open Patent Publication No. 2011-210750

In recent years, in order to enable a higher-current operation in a semiconductor device using a nitride semiconductor, there has been actively studied a technique to implant ions to a nitride semiconductor layer under an ohmic electrode such as a drain electrode to reduce a contact resistance of the nitride semiconductor layer with the ohmic electrode. There has also been studied a technique to improve an operating current by increasing an Al composition ratio of an AlGaN layer of a nitride semiconductor.

However, in both of the techniques, the concentration of current density on an electrode end of the ohmic electrode is unavoidable. This concentration of the current density involves a concern that the ohmic electrode may suffer breakdown due to the current concentration on the electrode end at the time of a high-current operation which is desired in future.

SUMMARY

A compound semiconductor device according to an aspect includes: a compound semiconductor layer; a pair of electrodes formed on an upper side of the compound semiconductor layer; and a high-resistance layer disposed in a lower portion of at least one electrode out of the pair of electrodes and higher in an electric resistance value than the electrodes.

A method of manufacturing a compound semiconductor device according to an aspect includes: forming a compound semiconductor layer; and forming a pair of electrodes on an upper side of the compound semiconductor layer, wherein a high-resistance layer higher in an electric resistance value than the electrodes is formed in a lower portion of at least one electrode out of the pair of electrodes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2A to FIG. 2C, which are continued from FIG. 1A to FIG. 1C, are schematic cross-sectional views illustrating the method of manufacturing the AlGaN/GaN HEMT according to the first embodiment in order of steps.

FIG. 3A to FIG. 3C, which are continued from FIG. 2A to FIG. 2C, are schematic cross-sectional views illustrating the method of manufacturing the AlGaN/GaN HEMT according to the first embodiment in order of steps.

DESCRIPTION OF EMBODIMENTS

First Embodiment

In this embodiment, an AlGaN/GaN HEMT of a nitride semiconductor is disclosed as the compound semiconductor device.

FIG. 1A to FIG. 3C are schematic cross-sectional views illustrating a method of manufacturing the AlGaN/GaN HEMT according to the first embodiment in order of steps.

Figure 1A:
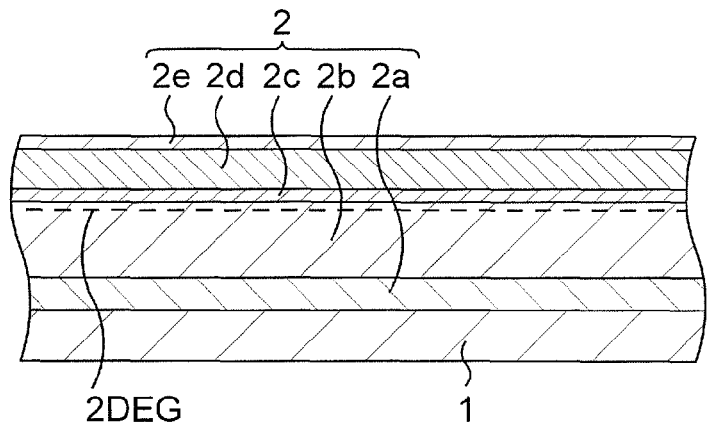
FIG. 1A to FIG. 1C are schematic cross-sectional views illustrating a method of manufacturing an AlGaN/GaN HEMT according to a first embodiment in order of steps.

First, as illustrated in FIG. 1A, a compound semiconductor stacked structure 2 is formed on, for example, a semi-insulating SiC substrate 1 as a growth substrate. As the growth substrate, a Si substrate, a sapphire substrate, a GaAs substrate, a GaN substrate, or the like may be used instead of the SiC substrate. Conductivity of the substrate may be either semi-insulating or conductive.

The compound semiconductor stacked structure 2 includes a buffer layer 2a, an electron transit layer 2b, an intermediate layer 2c, an electron supply layer 2d, and a cap layer 2e.

Two-dimensional electron gas (2DEG) being a transit electron is generated in the vicinity of an interface of the electron transit layer 2b with the electron supply layer 2d (to be exact, the intermediate layer 2c). This 2DEG is generated based on a difference in lattice constant between a compound semiconductor (here GaN) of the electron transit layer 2b and a compound semiconductor (here AlGaN) of the electron supply layer 2d.

In more detail, on the SiC substrate 1, the following compound semiconductors are grown by, for example, a MOVPE (Metal Organic Vapor Phase Epitaxy) method. A MBE (Molecular Beam Epitaxy) method or the like may be used instead of the MOVPE method.

On the SiC substrate 1, AlN with an about 100 nm thickness, i (intentionally undoped)-GaN with an about 3 μm thickness, i-AlGaN with an about 5 nm thickness, n-AlGaN with an about 30 nm thickness whose Al composition is, for instance, about 20%, and n-GaN with an about 10 nm thickness are sequentially grown. Consequently, the buffer layer 2a, the electron transit layer 2b, the intermediate layer 2c, the electron supply layer 2d, and the cap layer 2e are formed. As the buffer layer 2a, AlGaN may be used instead of AlN or GaN may be grown by low-temperature growth.

As a growth condition of AlN, mixed gas of trimethylaluminum (TMA) gas and ammonia ($NH_3$) gas is used as source gas. As a growth condition of GaN, mixed gas of trimethylgallium (TMG) gas and $NH_3$ gas is used as source gas. As a growth condition of AlGaN, mixed gas of TMA gas, TMG gas, and $NH_3$ gas is used as source gas. Depending on the compound semiconductor layer that is to be grown, whether or not to supply the TMA gas being an Al source and the TMG gas being a Ga source and their flow rates are appropriately set. A flow rate of the $NH_3$ gas being a common source is set to about 100 ccm to about 10 LM. Further, growth pressure is set to about 50 Torr to about 300 Torr, and growth temperature is set to about 1000° C. to about 1200° C.

In order to grow n-AlGaN of the electron supply layer 2d and n-GaN of the cap layer 2e, for example, $SiH_4$ gas containing, for instance, Si is added as n-type impurities to the source gas at a predetermined flow rate, so that AlGaN and GaN are doped with Si. A doping concentration of Si is set to about $1\times10^{18}/cm^3$ to about $1\times10^{20}/cm^3$, for example, set to about $5\times10^{18}/cm^3$.

Subsequently, element isolation structures are formed.

In more detail, argon (Ar), for instance, is injected to element isolation regions of the compound semiconductor stacked structure 2. Consequently, the element isolation structures are formed in at least the electron transit layer 2b of the compound semiconductor stacked structure 2. The element isolation structures demarcate an active region on the compound semiconductor stacked structure 2.

Incidentally, instead of the above injection method, a STI (Shallow Trench Isolation) method, for instance, may be used for the element isolation. At this time, chlorine-based etching gas, for instance, is used for dry-etching of the compound semiconductor stacked structure 2.

Figure 1B:
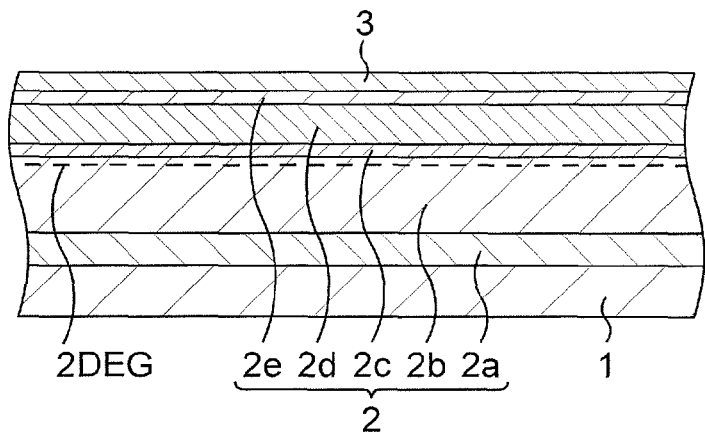
Figure 1C:
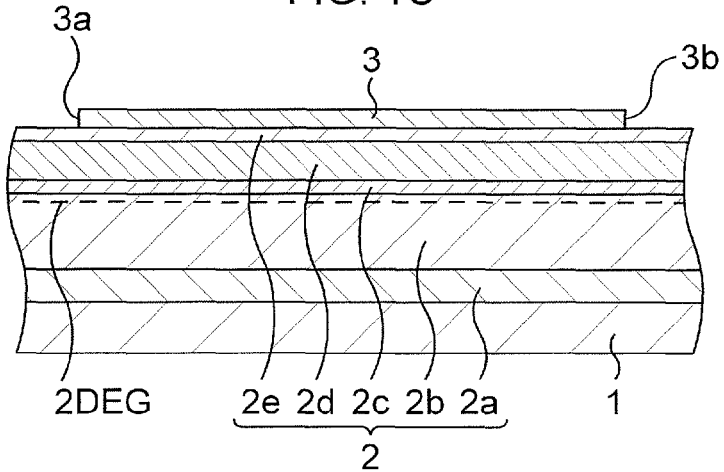

Subsequently, a silicon nitride film 3 is formed as illustrated in FIG. 1B.

In more detail, a silicon nitride (SiN) with a thickness of about 10 nm to about 5000 nm, for example, about 100 nm is deposited on the compound semiconductor stacked structure 2 by a plasma CVD method, a sputtering method, or the like. Consequently, the silicon nitride film 3 is formed. The silicon nitride film 3 is formed so that its SiN composition is Si-richer than that of $Si_3N_4$. Consequently, the diffusion of Si of the silicon nitride film 3 is promoted by later-described heat treatment. Concretely, the silicon nitride film 3 is formed as $Si_{3+x}N_{4-x}$ so that the condition of $0 \le x \le 1$ is satisfied. In order to form the silicon nitride film 3 in such a Si-rich state, for example, a ratio of $SiH_4/NH_3$ being source gas used at the time of film formation is made 1 or more as a film formation condition.

Subsequently, as illustrated in FIG. 10, electrode recesses 3a, 3b for a source electrode and a drain electrode are formed in the silicon nitride film 3.

In more detail, a resist is first applied on a surface of the silicon nitride film 3. The resist is processed by lithography, whereby openings from which portions corresponding to a region where to form the source electrode and a region where to form the drain electrode, in the surface of the silicon nitride film 3 are exposed are formed in the resist. Consequently, a resist mask having the openings is formed.

By using this resist mask, the planned electrode formation regions of the silicon nitride film 3 are dry-etched to be removed until a surface of the cap layer 2e is exposed. Consequently, the electrode recess 3a from which the region where to form the source electrode in the surface of the cap layer 2e is exposed and the electrode recess 3b from which the region where to form the drain electrode in the surface of the cap layer 2e is exposed are formed in the silicon nitride film 3. For the dry etching, fluorine-based etching gas such as $SF_6$ is used, for instance. This dry etching is required to give as little etching damage as possible to the cap layer 2e, and the dry etching using the fluorine-based gas gives only a small damage to the electron supply layer 2d.

The resist mask is removed by ashing using oxygen plasma or by wetting using a chemical solution.

Subsequently, as illustrated in FIG. 2A, the source electrode 4 and the drain electrode 5 are formed.

In more detail, a resist is applied on the surface of the silicon nitride film 3. The resist is processed by lithography and openings from which the electrode recesses 3a, 3b are exposed are formed in the resist. Consequently, a resist mask having the openings is formed.

By using this resist mask, a conductive material containing Al, for example, Ti/Al is deposited as an electrode material on the resist mask including the inside of the openings from which the electrode recesses 3a, 3b are exposed, by, for example, a vapor deposition method. A thickness of Ti is about 30 nm and a thickness of Al is about 200 nm. The resist mask and Ti/Al deposited thereon are removed by a liftoff method. Consequently, the source electrode 4 and the drain electrode 5 part of whose electrode material fills the electrode recesses 3a, 3b are formed. In the source electrode 4 and the drain electrode 5, portions of their side surfaces facing each other are in contact with the silicon nitride film 3.

Subsequently, as illustrated in FIG. 2B, an ohmic characteristic of the source electrode 4 and the drain electrode 5 is established and Al—Si—N layers 6 are formed.

In more detail, the SiC substrate 1 is heat-treated in, for example, a nitrogen atmosphere at a temperature of about 400° C. to about 900° C., for example, about 580° C. Consequently, Ti/Al of the source electrode 4 and the drain electrode 5 is in ohmic contact with the cap layer 2e, so that the ohmic characteristic is established. At the same time, the heat treatment causes Al of the source electrode 4 and the drain electrode 5 and Si and N of the silicon nitride film 3 to diffuse to each other in the portions where the source electrode 4 and the drain electrode 5 are in contact with the silicon nitride film 3. Consequently, the Al—Si—N layers 6 containing an Al—Si—N compound are formed from lower portions of the source electrode 4 and the drain electrode 5 up to portions of the silicon nitride film 3.

In the lower portions of the source electrode 4 and the drain electrode 5, an Al content ratio of each of the Al—Si—N layers 6 gradually decreases from 80% or more, here about 100% from its end portion toward the vicinity of an interface with the silicon nitride film 3. The Al—Si—N layers 6 are high-resistance layers higher in an electric resistance value than the source electrode 4 and the drain electrode 5. The Al—Si—N compound contained in the Al—Si—N layers 6, assuming that it is an $Al_x$—$Si_y$—$N_z$ compound, is a compound that satisfies $x+y+z=1$ and $0<x<1$ and further satisfies $0<y<1$ and $0<z<1$.

Subsequently, as illustrated in FIG. 2C, the Al—Si—N layers 6 are left only in the lower portions of the source electrode 4 and the drain electrode 5.

In more detail, a resist is applied on the surface of the silicon nitride film 3. The resist is processed by lithography, whereby an opening from which a region between the source electrode 4 and the drain electrode 5 is exposed is formed. Consequently, a resist mask having the opening is formed.

By using this resist mask, the silicon nitride film 3 and the portions of the Al—Si—N layers 6 existing on the region between the source electrode 4 and the drain electrode 5 are removed by dry etching until the surface of the cap layer 2e is exposed. These portions of the Al—Si—N layers 6 are unnecessary portions which are formed because Al—Si—N is generated across the facing side surfaces of the source electrode 4 and the drain electrode 5. For the dry etching, fluorine-based etching gas such as $SF_6$, for instance, is used. As a result of this etching, the silicon nitride film 3 is removed and the Al—Si—N layers 6 remain only in the lower portions of the source electrode 4 and the drain electrode 5. The residual Al—Si—N layers 6 are each locally provided in an electrode end closer to the other electrode (the drain electrode 5 as for the source electrode 4, and the source electrode 4 as for the drain electrode 5) in the relevant lower portion.

A contact area between each of the Al—Si—N layers 6 and the compound semiconductor stacked structure 2 is, for example, about 1/100 of a contact area between the source electrode 4 (drain electrode 5) and the compound semiconductor stacked structure 2. In portions where the source electrode 4 and the drain electrode 5 are directly in contact with the surface of the compound semiconductor stacked structure 2, a contact resistance (ρc) is about $10^{-6}$ Ω·cm$^2$ and in portions where the Al—Si—N layers 6 are in contact with this surface, the contact resistance is about $10^{-6}$ Ω·cm$^2$ to about $10^{-1}$ Ω·cm$^2$.

Incidentally, the Al—Si—N layer may be left in the lower portion of only one of the source electrode 4 and the drain electrode 5, for example, the drain electrode 5. In this case, for example, the electrode recess for the source electrode 4 is formed wider than the electrode recess 3b in the silicon nitride film 3 in the step in FIG. 1C, and the source electrode 4 is formed to be apart from the silicon nitride film 3 in the step in FIG. 2A. In the subsequent step in FIG. 2B, the Al—Si—N layer 6 is formed only in the drain electrode 5 side.

Subsequently, as illustrated in FIG. 3A, a protective insulating film 7 is formed on the region between the source electrode 4 and the drain electrode 5.

In more detail, a resist is applied on the surface of the compound semiconductor stacked structure 2. The resist is processed by lithography, whereby an opening from which the region between the source electrode 4 and the drain electrode 5 is exposed is formed. Consequently, a resist mask having the opening is formed.

By using this resist mask, a silicon nitride (SiN) with an about 10 nm to about 5000 nm thickness, for example, an about 100 nm thickness is deposited by a plasma CVD method, a sputtering method, or the like. The resist mask and SiN deposited thereon are removed by a liftoff method. Consequently, the protective insulating film 7 is formed on the region between the source electrode 4 and the drain electrode 5 on the compound semiconductor stacked structure 2.

The use of SiN for a passivation film covering the compound semiconductor stacked structure 2 can reduce a current collapse.

Subsequently, as illustrated in FIG. 3B, an electrode recess 7a for a gate electrode is formed in the protective insulating film 7.

In more detail, a resist is first applied on a surface of the protective insulating film 7. The resist is processed by lithography, whereby an opening from which a portion corresponding to a region where to form the gate electrode, in the surface of the protective insulating film 7 is exposed is formed in the resist. Consequently, a resist mask having the opening is formed.

By using this resist mask, the region where to form the gate electrode, in the protective insulating film 7 is dry-etched to be removed until the surface of the cap layer 2e is exposed. Consequently, the electrode recess 7a from which the region where to form the gate electrode, in the surface of the cap layer 2e is exposed is formed in the protective insulating film 7. For the dry etching, fluorine-based etching gas such as $SF_6$ is used, for instance.

The resist mask is removed by ashing using oxygen plasma or by wetting using a chemical solution.

Subsequently, the gate electrode 8 is formed as illustrated in FIG. 3C.

In more detail, a resist is first applied on the protective insulating film 7. The resist is processed by lithography, whereby an opening from which the electrode recess 7a is exposed is formed in the resist. Consequently, a resist mask having the opening is formed.

By using this resist mask, for example, Ni/Au is deposited as an electrode material on the resist mask including the inside of the opening from which the electrode recess 7a of the protective insulating film 7 is exposed, by a vapor deposition method, for instance. A thickness of Ni is about 30 nm and a thickness of Au is about 400 nm. The resist mask and Ni/Au deposited thereon are removed by a liftoff method. Consequently, the gate electrode 8 part of whose electrode material in its lower portion fills the inside of the electrode recess 7a is formed.

Thereafter, through various processes such as the formation of an interlayer insulating film, the formation of wirings connected to the source electrode 4, the drain electrode 5, and the gate electrode 8, the formation of an upper protective film, and the formation of connection electrodes exposed to the uppermost surface, the AlGaN/GaN HEMT according to this embodiment is formed.

Here, a comparative example of this embodiment will be described.

Figure 4A:
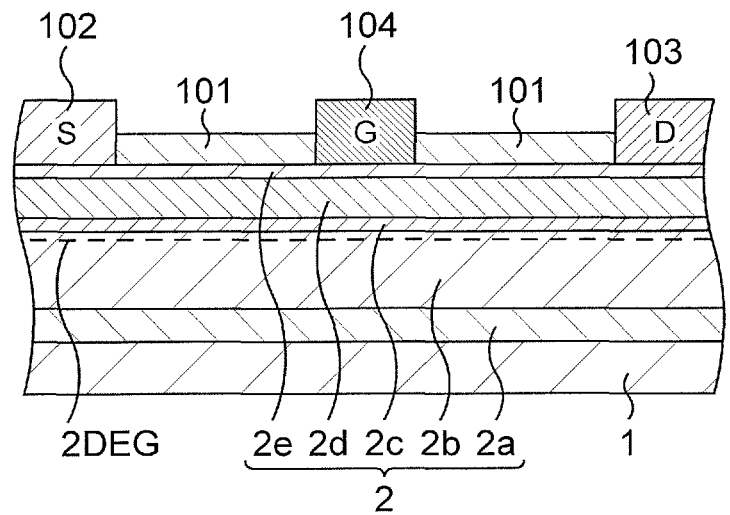
FIG. 4A and FIG. 4B are schematic cross-sectional views illustrating an AlGaN/GaN HEMT according to a comparative example.

An AlGaN/GaN HEMT of the comparative example has a SiC substrate 1 and a compound semiconductor stacked structure 2 similarly to this embodiment as illustrated in FIG. 4A. A source electrode 102, a drain electrode 103, and a gate electrode 104 are formed on the compound semiconductor stacked structure 2, and a protective insulating film 101 of SiN covering the compound semiconductor stacked structure 2 is formed.

Figure 4B:
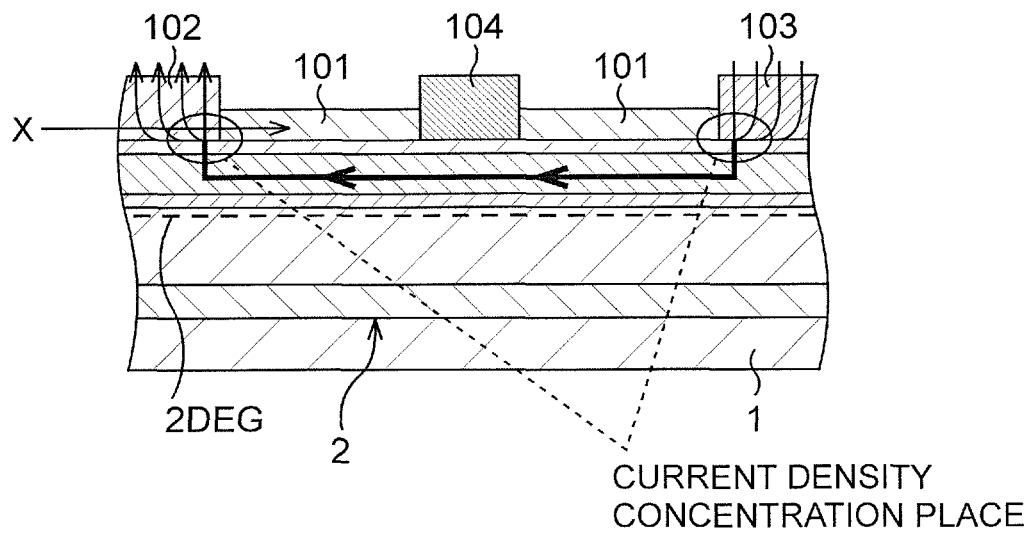

In the AlGaN/GaN HEMT of the comparative example, electrons of 2DEG run from the source electrode 102 toward the drain electrode 103 to the electron transit layer 2b. In this case, as illustrated in FIG. 4B, a current flows from the drain electrode 103 toward the source electrode 102, and one end portion of the source electrode 102 and one end portion of the drain electrode 103 are places where current density concentrates.

Figure 5:
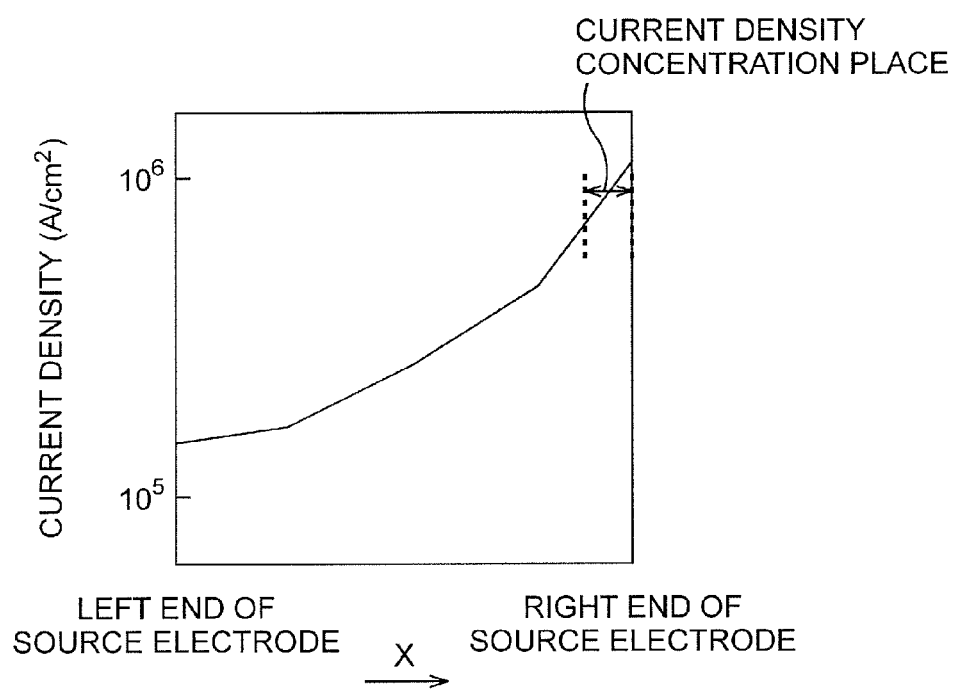
FIG. 5 is a characteristic chart representing a result when the distribution of current density is studied, taking a source electrode as an example, regarding the AlGaN/GaN HEMT of the comparative example.

Regarding the AlGaN/GaN HEMT of the comparative example, the distribution of current density was studied, taking the source electrode as an example. The result is presented in FIG. 5. In FIG. 5, an X axis is defined in parallel to a horizontal surface in an Al portion of the source electrode 102 as represented by the arrow X in FIG. 4B, and the current density corresponding to a position X is presented. The current density increases from a left end toward a right end of the source electrode 102, and it is confirmed that the right end of the source electrode 102 is a place where the current density concentrates.

Figure 6A:
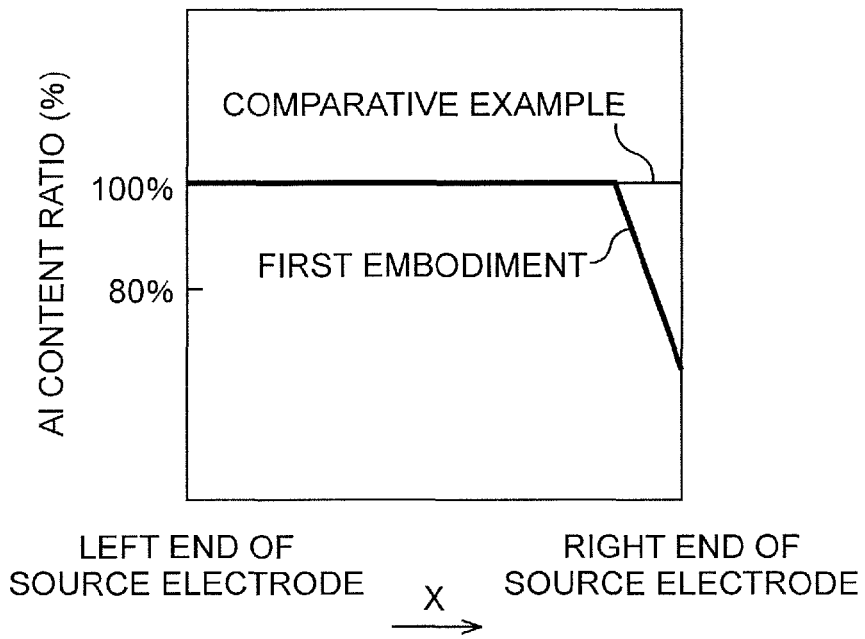
FIG. 6A and FIG. 6B are characteristic charts representing results when the distribution of an Al content ratio and the distribution of current density are studied, taking a source electrode as an example, regarding the AlGaN/GaN HEMT of the first embodiment, based on comparison with the comparative example.

Regarding the AlGaN/GaN HEMT according to this embodiment, the distribution of an Al content ratio was studied, taking the source electrode as an example, based on comparison with the comparative example in FIG. 4A. The result is presented in FIG. 6A. In FIG. 6A, an X axis is defined in parallel to a horizontal surface in an Al portion of the source electrode and an Al content ratio corresponding to a position X is presented, as in FIG. 5. In the comparative example, the Al content ratio is uniformly about 100% in the whole source electrode. On the other hand, in this embodiment, in a portion of the source electrode, where the Al—Si—N layer is not present, the Al content ratio is uniformly about 100%. In the Al—Si—N layer, the Al content ratio gradually decreases from about 100% toward the vicinity of the interface with the silicon nitride film 3.

Figure 6B:
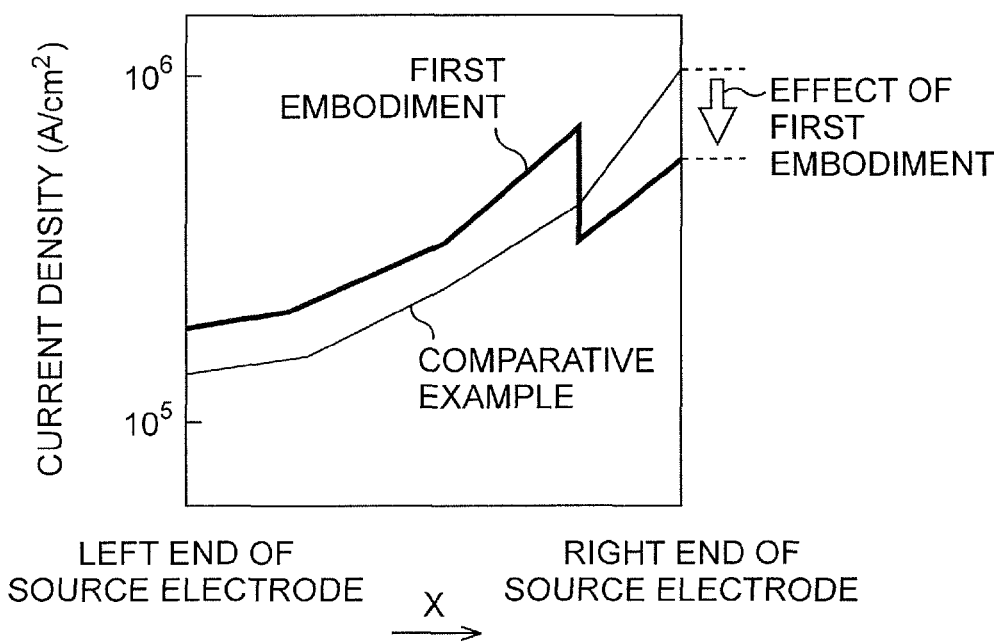

Regarding the AlGaN/GaN HEMT according to this embodiment, the distribution of current density was studied, taking the source electrode as an example, based on comparison with the comparative example in FIG. 4A. The result is presented in FIG. 6B. In FIG. 6B, an X axis is defined in parallel to the horizontal surface in the Al portion of the source electrode and the current density corresponding to the position X is presented as in FIG. 5. In the comparative example, the current density increases from the left end toward the right end of the source electrode, and one end portion of the source electrode is a place where the current density concentrates. On the other hand, in this embodiment, the current density increases from the left end toward the right end of the source electrode, but it greatly reduces at a position of the Al—Si—N layer being higher in resistance than the source electrode, and increases again. Since the current density reduces at the position of the Al—Si—N layer, the current density is considerably lower at the right end of the source electrode as compared with the comparative example. Thus, in this embodiment, the current density at one end portion of the source electrode (and the drain electrode) is alleviated.

As described above, according to this embodiment, a highly reliable and high-withstand-voltage AlGaN/GaN HEMT that enables a high-current operation by alleviating the current density of the source electrode 4 and the drain electrode 5 is realized.

Second Embodiment

In this embodiment, a structure and a manufacturing method of an AlGaN/GaN HEMT are disclosed as in the first embodiment, but a form of an Al—Si—N layer is different from that of the first embodiment. Note that the same constituent members and so on as those of the first embodiment will be denoted by the same reference signs and a detailed description thereof will be omitted FIG. 7A to FIG. 7C and FIG. 8A to FIG. 8C are schematic cross-sectional views illustrating main steps of the method of manufacturing the AlGaN/GaN HEMT according to the second embodiment.

Figure 7A:
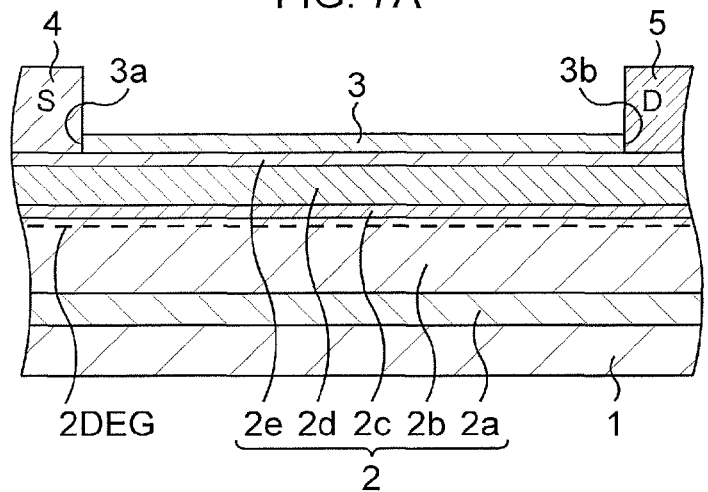
FIG. 7A to FIG. 7C are schematic cross-sectional views illustrating main steps of a method of manufacturing an AlGaN/GaN HEMT according to a second embodiment.

In this embodiment, the steps in FIG. 1A to FIG. 2A are first performed as in the first embodiment. At this time, a source electrode 4 and a drain electrode 5 are formed so that portions of their side surfaces facing each other are in contact with a silicon nitride film 3. A state at this time is illustrated in FIG. 7A.

Figure 7B:
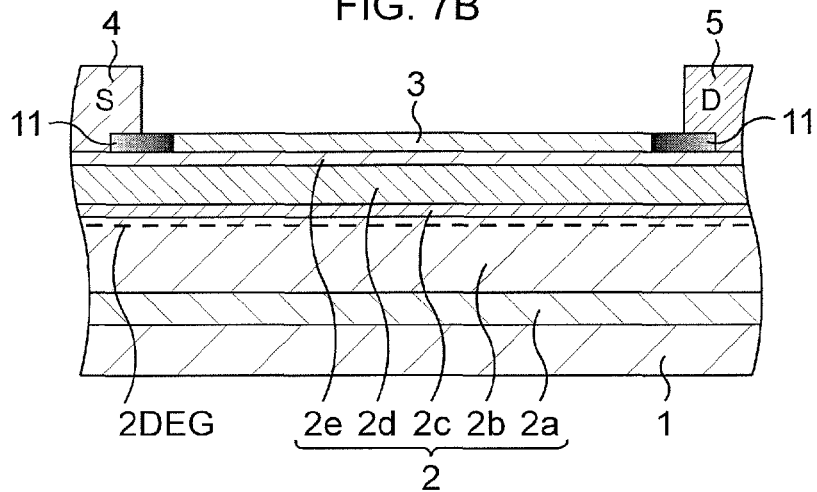

Subsequently, as illustrated in FIG. 7B, an ohmic characteristic of the source electrode 4 and the drain electrode 5 is established and Al—Si—N layers 11 are formed.

In more detail, a SiC substrate 1 is heat-treated in, for example, a nitrogen atmosphere at a temperature of about 900° C. to about 1200° C., for example, about 900° C. higher than the temperature for forming the Al—Si—N layers 6 in the first embodiment. Consequently, Ti/Al of the source electrode 4 and the drain electrode 5 is in ohmic contact with an electron supply layer 2d, so that the ohmic characteristic is established. At the same time, the heat treatment causes Al of the source electrode 4 and the drain electrode 5 and Si and N of the silicon nitride film 3 to diffuse to each other in the portions where the source electrode 4 and the drain electrode 5 are in contact with the silicon nitride film 3. Consequently, the Al—Si—N layers 11 containing an Al—Si—N compound are formed from lower portions of the source electrode 4 and the drain electrode 5 up to portions of the silicon nitride film 3. In this embodiment, since the temperature of the heat treatment is higher than that in the first embodiment, the distribution of the mutual diffusion of Al, Si, N in the Al—Si—N layers 11 is wider than that in the Al—Si—N layers 6 of the first embodiment.

In the lower portions of the source electrode 4 and the drain electrode 5, an Al content ratio of each of the Al—Si—N layers 11 gradually decreases from 80% or more, here about 100% from its end portion toward the vicinity of an interface with the silicon nitride film 3. The Al—Si—N layers 11 are high-resistance layers higher in an electric resistance value than the source electrode 4 and the drain electrode 5. The Al—Si—N compound contained in the Al—Si—N layers 11, assuming that it is an $Al_x$—$Si_y$—$N_z$ compound, is a compound that satisfies $$x+y+z=1$$

and $$0<x<1$$

and further satisfies $$0<y<1$$

and $$0<z<1.$$

Figure 7C:
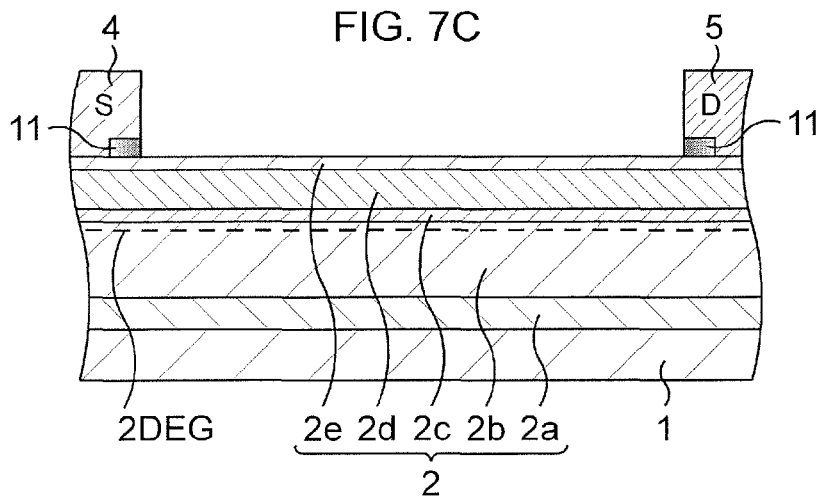

Subsequently, as illustrated in FIG. 7C, the Al—Si—N layers 11 are left only in the lower portions of the source electrode 4 and the drain electrode 5.

In more detail, a resist is applied on a surface of the silicon nitride film 3. The resist is processed by lithography, thereby forming an opening from which a region between the source electrode 4 and the drain electrode 5 is exposed. Consequently, a resist mask having the opening is formed.

By using this resist mask, the silicon nitride film 3 and the portions of the Al—Si—N layers 11 existing on the region between the source electrode 4 and the drain electrode 5 are removed by dry etching until a surface of a cap layer 2e is exposed. These portions of the Al—Si—N layers 11 are unnecessary portions which are formed because Al—Si—N is generated across the facing side surfaces of the source electrode 4 and the drain electrode 5. For the dry etching, fluorine-based etching gas such as $SF_6$, for instance is used. As a result of this etching, the silicon nitride film 3 is removed and the Al—Si—N layers 11 remain only in the lower portions of the source electrode 4 and the drain electrode 5. The residual Al—Si—N layers 11 are each locally provided in an electrode end closer to the other electrode (the drain electrode 5 as for the source electrode 4, and the source electrode 4 as for the drain electrode 5) in the relevant lower portion.

A contact area between each of the Al—Si—N layers 11 and a compound semiconductor stacked structure 2 is, for example, about 1/100 of a contact area between the source electrode 4 (drain electrode 5) and the compound semiconductor stacked structure 2. In portions where the source electrode 4 and the drain electrode 5 are directly in contact with a surface of the compound semiconductor stacked structure 2, a contact resistance is about $10^{-6}$ $\Omega \cdot cm^2$ and in portions where the Al—Si—N layers 11 are in contact with this surface, the contact resistance is about $10^{-6}$ $\Omega \cdot cm^2$ to about $10^{-1}$ $\Omega \cdot cm^2$.

Incidentally, the Al—Si—N layer may be left in the lower portion of only one of the source electrode 4 and the drain electrode 5, for example, the drain electrode 5. In this case, the electrode recess for the source electrode 4 is formed wider than the electrode recess 3b in the silicon nitride film 3 in the step in FIG. 1C, and the source electrode 4 is formed to be apart from the silicon nitride film 3 in the step in FIG. 2A. In the subsequent step in FIG. 7B, the Al—Si—N layer 11 is formed only in the drain electrode 5 side.

Figure 8A:
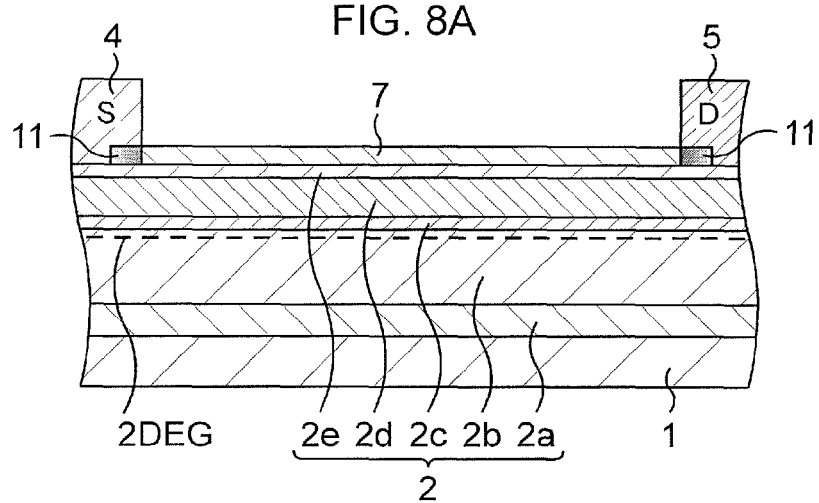
FIG. 8A to FIG. 8C, which are continued from FIG. 7A to FIG. 7C, are schematic cross-sectional views illustrating main steps of the method of manufacturing the AlGaN/GaN HEMT according to the second embodiment.

Subsequently, as illustrated in FIG. 8A, a protective insulating film 7 is formed on the region between the source electrode 4 and the drain electrode 5.

In more detail, a resist is applied on the surface of the compound semiconductor stacked structure 2. The resist is processed by lithography, whereby an opening from which the region between the source electrode 4 and the drain electrode 5 is exposed is formed. Consequently, a resist mask having the opening is formed.

By using this resist mask, SiN with an about 10 nm to about 5000 nm thickness, for example, an about 100 nm thickness is deposited by a plasma CVD method, a sputtering method, or the like. The resist mask and SiN deposited thereon are removed by a liftoff method. Consequently, the protective insulating film 7 is formed on the region between the source electrode 4 and the drain electrode 5 on the compound semiconductor stacked structure 2.

Figure 8B:
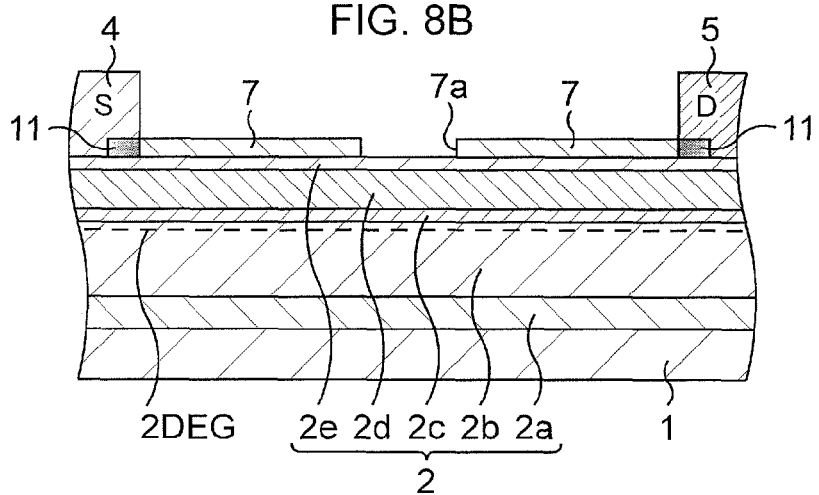

Subsequently, as illustrated in FIG. 8B, an electrode recess 7a for a gate electrode is formed in the protective insulating film 7.

In more detail, a resist is first applied on a surface of the protective insulating film 7. The resist is processed by lithography, whereby an opening from which a portion corresponding to a region where to form the gate electrode, in the surface of the protective insulating film 7 is exposed, is formed in the resist. Consequently, a resist mask having the opening is formed.

By using this resist mask, the region where to form the gate electrode in the protective insulating film 7 is dry-etched to be removed until the surface of the cap layer 2e is exposed. Consequently, the electrode recess 7a from which the region where to form the gate electrode in the surface of the cap layer 2e is exposed is formed in the protective insulating film 7. For the dry etching, fluorine-based etching gas such as $SF_6$ is used, for instance.

The resist mask is removed by ashing using oxygen plasma or by wetting using a chemical solution.

Figure 8C:
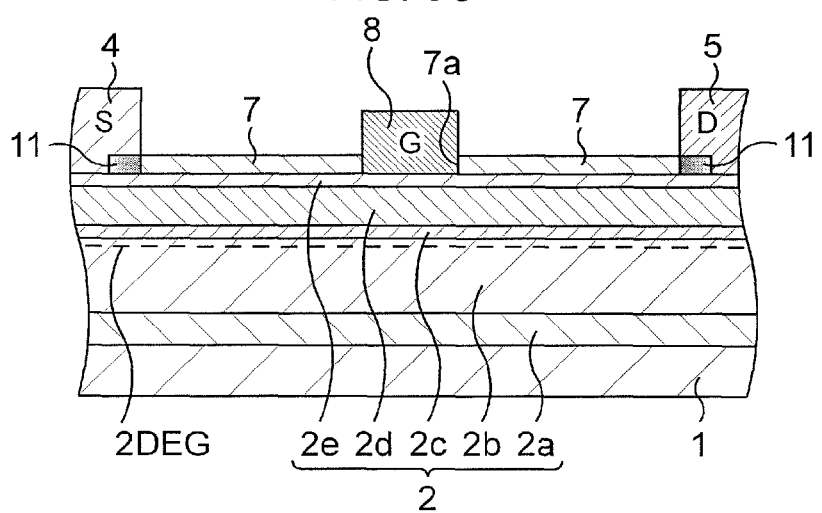

Subsequently, the gate electrode 8 is formed as illustrated in FIG. 8C.

In more detail, a resist is first applied on the protective insulating film 7. The resist is processed by lithography, whereby an opening from which the electrode recess 7a is exposed is formed in the resist. Consequently, a resist mask having the opening is formed.

By using this resist mask, for example, Ni/Au is deposited as an electrode material on the resist mask including the inside of the opening from which the electrode recess 7a of the protective insulating film 7 is exposed, by a vapor deposition method, for instance. A thickness of Ni is about 30 nm and a thickness of Au is about 400 nm. The resist mask and Ni/Au deposited thereon are removed by a liftoff method. Consequently, the gate electrode 8 part of whose electrode material in its lower portion fills the inside of the electrode recess 7a is formed.

Thereafter, through various processes such as the formation of an interlayer insulating film, the formation of wirings connected to the source electrode 4, the drain electrode 5, and the gate electrode 8, the formation of an upper protective film, and the formation of connection electrodes exposed to the uppermost surface, the AlGaN/GaN HEMT according to this embodiment is formed.

Figure 9A:
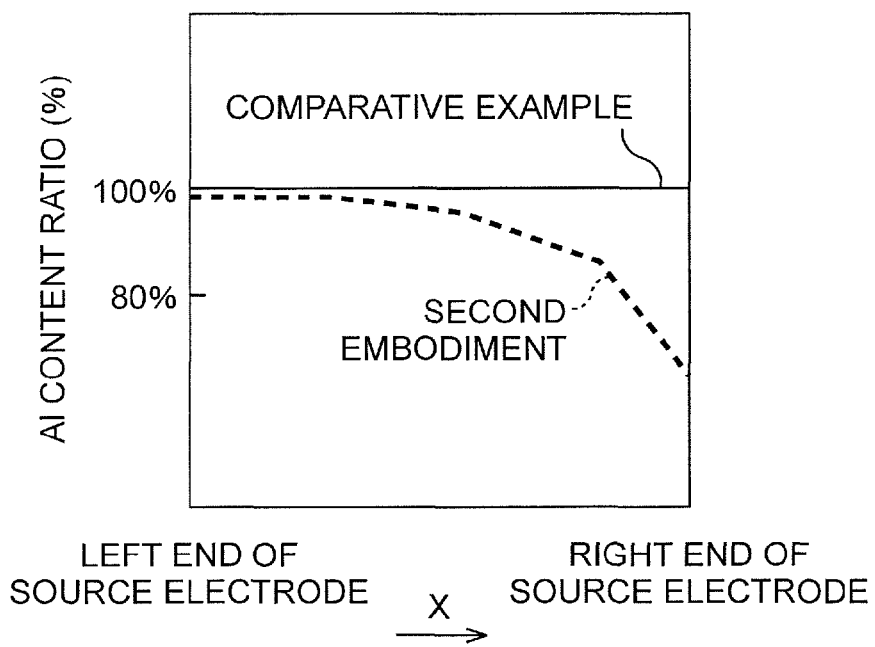
FIG. 9A and FIG. 9B are characteristic charts representing results when the distribution of an Al content ratio and the distribution of current density are studied, taking a source electrode as an example, regarding the AlGaN/GaN HEMT according to the second embodiment, based on comparison with the comparative example.

Regarding the AlGaN/GaN HEMT according to this embodiment, the distribution of an Al content ratio was studied, taking the source electrode as an example, based on comparison with the comparative example in FIG. 4A. The result is presented in FIG. 9A. In FIG. 9A, an X axis is defined in parallel to a horizontal surface in an Al portion of the source electrode and an Al content ratio corresponding to a position X is presented, as in FIG. 5. In the comparative example, the Al content ratio is uniformly about 100% in the whole source electrode. On the other hand, in this embodiment, the Al content ratio gradually decreases from about 100% from a left end of the source electrode toward its right end.

Figure 9B:
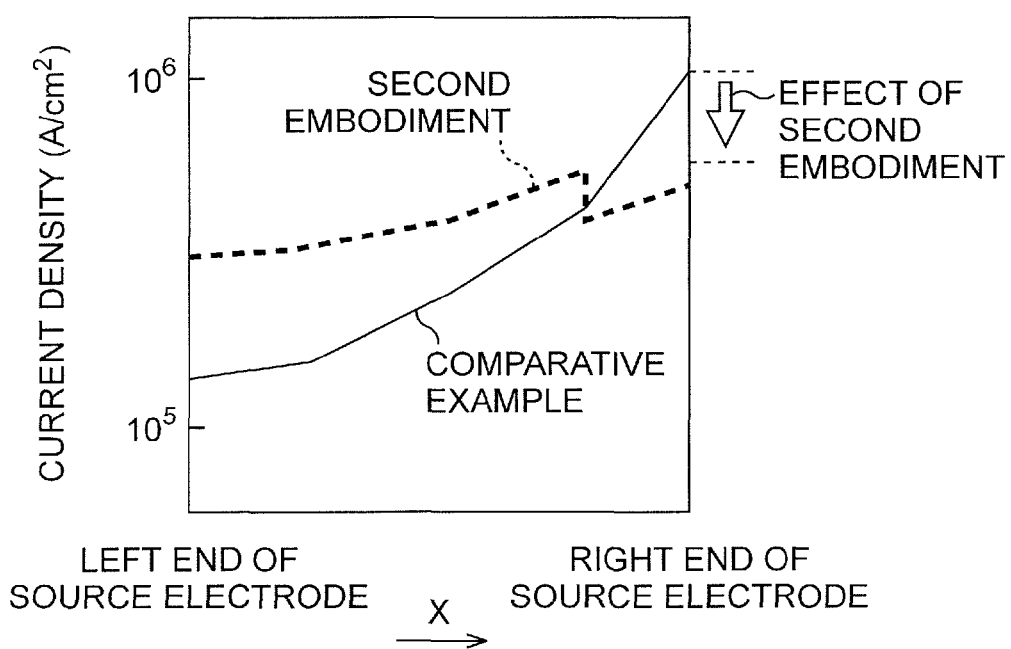

Regarding the AlGaN/GaN HEMT according to this embodiment, the distribution of current density was studied, taking the source electrode as an example, based on comparison with the comparative example in FIG. 4A. The result is presented in FIG. 9B. In FIG. 9B, an X axis is defined in parallel to the horizontal surface in the Al portion of the source electrode and the current density corresponding to the position X is presented as in FIG. 5. In the comparative example, the current density increases from the left end toward the right end of the source electrode, and one end portion of the source electrode is a place where the current density concentrates. On the other hand, in this embodiment, the current density gradually increases from the left end toward the right end of the source electrode, but it greatly reduces at a position of the Al—Si—N layer being higher in resistance than the source electrode, and increases again. Since the current density reduces at the position of the Al—Si—N layer, the current density is considerably lower at the right end of the source electrode as compared with the comparative example. Thus, in this embodiment, the current density at one end portion of the source electrode (and the drain electrode) is alleviated as compared with the comparative example.

As described above, according to this embodiment, a highly reliable and high-withstand-voltage AlGaN/GaN HEMT that enables a high-current operation by alleviating the current density of the source electrode 4 and the drain electrode 5 is realized.

Third Embodiment

In this embodiment, a structure and a manufacturing method of an AlGaN/GaN HEMT are disclosed as in the first embodiment, but a form of a high-resistance layer is different from that of the first embodiment. Note that the same constituent members and so on as those of the first embodiment will be denoted by the same reference signs and a detailed description thereof will be omitted.

FIG. 10A to FIG. 10C and FIG. 11A to FIG. 11C are schematic cross-sectional views illustrating main steps of the method of manufacturing the AlGaN/GaN HEMT according to the third embodiment.

Figure 10A:
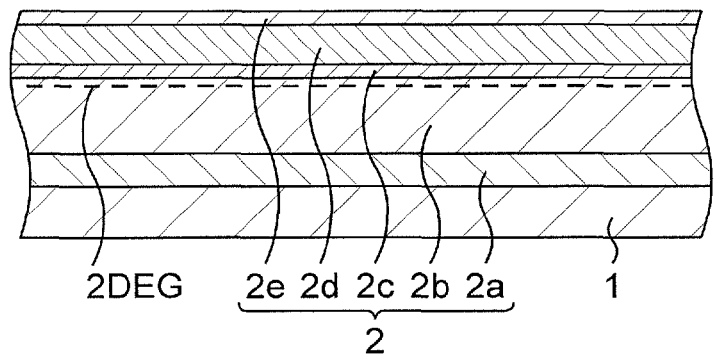
FIG. 10A to FIG. 10C are schematic cross-sectional views illustrating main steps of a method of manufacturing an AlGaN/GaN HEMT according to a third embodiment.

In this embodiment, the step in FIG. 1A is first performed as in the first embodiment. At this time, a compound semiconductor stacked structure 2 having a buffer layer 2a, an electron transit layer 2b, an intermediate layer 2c, an electron supply layer 2d, and a cap layer 2e is formed on a SiC substrate 1. A state at this time is illustrated in FIG. 10A.

Figure 10B:
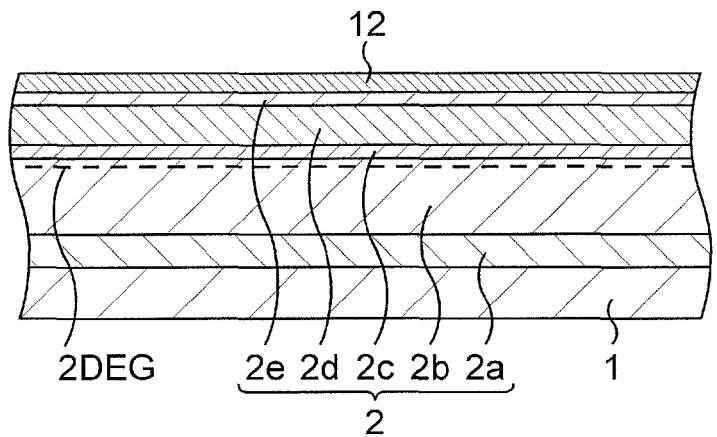

Subsequently, an Al—Si layer 12 is formed as illustrated in FIG. 10B.

In more detail, aluminum silicide (Al—Si) with an about 1 nm to about 100 nm thickness, for example, an about 2 nm thickness is deposited on the compound semiconductor stacked structure 2 by a sputtering method or the like. Consequently, the Al—Si layer 12 is formed.

The Al—Si layer 12 is a high-resistance layer higher in an electric resistance value than a source electrode and a drain electrode which will be described later. An Al—Si compound contained in the Al—Si layer 12, assuming that it is an $Al_x$—$Si_y$—$N_z$ compound, is a compound that satisfies $x+y+z=1$ and $0<x<1$ and further satisfies $0<y<1$ and $z=0$.

Figure 10C:
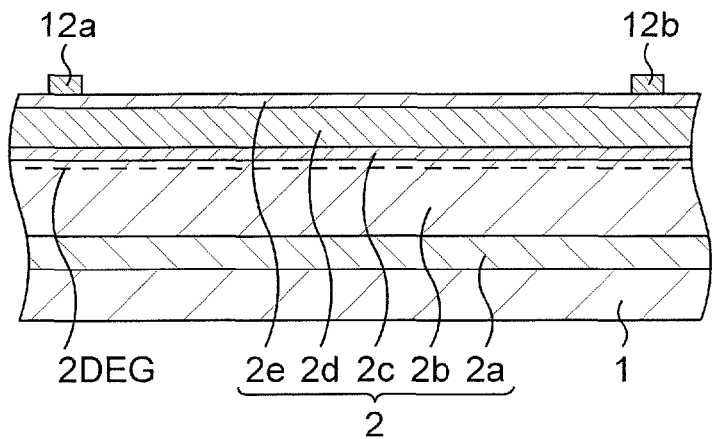

Subsequently, the Al—Si layer 12 is processed as illustrated in FIG. 10C.

In more detail, a resist is first applied on a surface of the Al—Si layer 12. The resist is processed by lithography, thereby forming a resist mask covering portions, of the surface of the Al—Si layer 12, corresponding to the inside of a region where to form the source electrode and the inside of a region where to form the drain electrode.

By using this resist mask, the Al—Si layer 12 except the portions in the planned electrode formation regions is dry-etched to be removed until a surface of the cap layer 2e is exposed. For the dry etching, fluorine-based etching gas such as $SF_6$ is used, for instance. Consequently, the Al—Si layer 12 is left inside the region where to form the source electrode and the region where to form the drain electrode on the cap layer 2e. The Al—Si layer 12 left in the region where to form the source electrode is referred to as an Al—Si layer 12a, and the Al—Si layer 12 left in the region where to form the drain electrode is referred to as an Al—Si layer 12b.

The resist mask is removed by ashing using oxygen plasma or by wetting using a predetermined chemical solution.

Figure 11A:
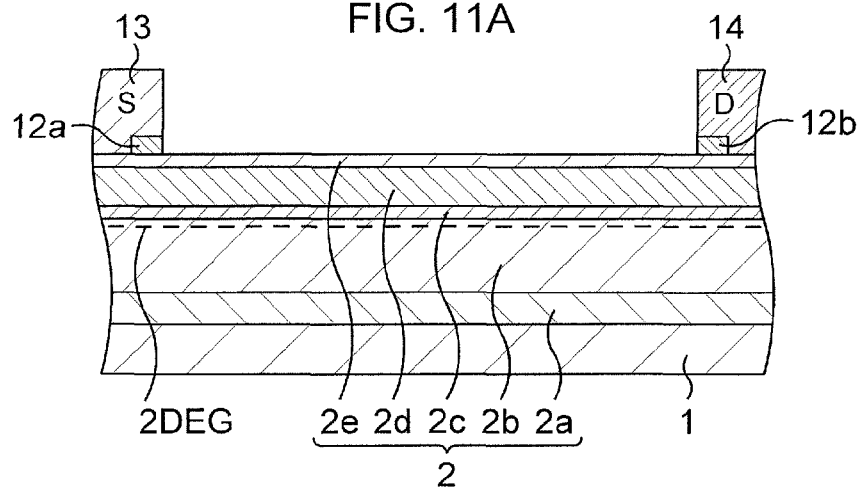
FIG. 11A to FIG. 11C, which are continued from FIG. 10A to FIG. 10C, are schematic cross-sectional views illustrating main steps of the method of manufacturing the AlGaN/GaN HEMT according to the third embodiment.

Subsequently, the source electrode 13 and the drain electrode 14 are formed as illustrated in FIG. 11A.

In more detail, a resist is applied on a surface of the compound semiconductor stacked structure 2. The resist is processed by lithography, whereby openings from which regions including the Al—Si layers 12a, 12b are exposed are formed in the resist. Consequently, a resist mask having the openings is formed.

By using this resist mask, a conductive material containing Al, for example, Ti/Al is deposited as an electrode material on the resist mask including the inside of the openings from which the regions including the Al—Si layers 12a, 12b are exposed, by, for example, a vapor deposition method. A thickness of Ti is about 30 nm and a thickness of Al is about 200 nm. The resist mask and Ti/Al deposited thereon are removed by a liftoff method. Consequently, the source electrode 13 including the Al—Si layer 12a in its lower portion and the drain electrode 14 including the Al—Si layer 12b in its lower portion are formed on the compound semiconductor stacked structure 2. In the source electrode 13 and the drain electrode 14, the Al—Si layers 12a, 12b are locally provided in respective electrode ends so that ends of the Al—Si layers 12a, 12b are exposed from side surfaces facing each other of the source electrode 13 and the drain electrode 14. The Al—Si layers 12a, 12b are high-resistance layers higher in an electric resistance value than the source electrode 13 and the drain electrode 14.

Subsequently, the SiC substrate 1 is heat-treated in, for example, a nitrogen atmosphere at a temperature of about 400° C. to about 1000° C., for example, about 550° C. Consequently, Ti/Al of the source electrode 13 and the drain electrode 14 is in ohmic contact with the cap layer 2e, so that an ohmic characteristic is established.

Figure 11B:
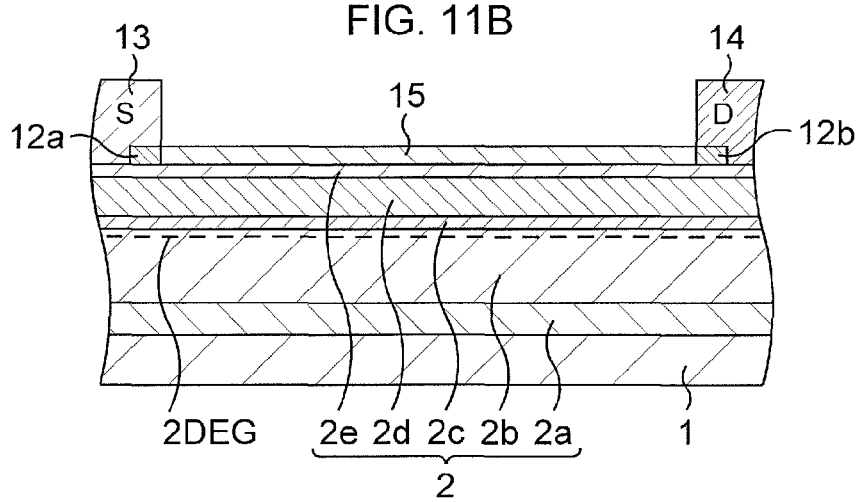

Subsequently, as illustrated in FIG. 11B, a protective insulating film 15 is formed on a region between the source electrode 13 and the drain electrode 14.

In more detail, SiN with an about 10 nm to about 5000 nm thickness, for example, an about 100 nm thickness is deposited on the compound semiconductor stacked structure 2 by a plasma CVD method, a sputtering method, or the like. SiN deposited on the source electrode 13 and the drain electrode 14 is removed by lithography, dry etching, and so on. A resist mask used for the lithography is removed by ashing using oxygen plasma or by wetting using a predetermined chemical solution. Consequently, on the compound semiconductor stacked structure 2, the protective insulating film 15 is formed on the region between the source electrode 13 and the drain electrode 14.

Figure 11C:
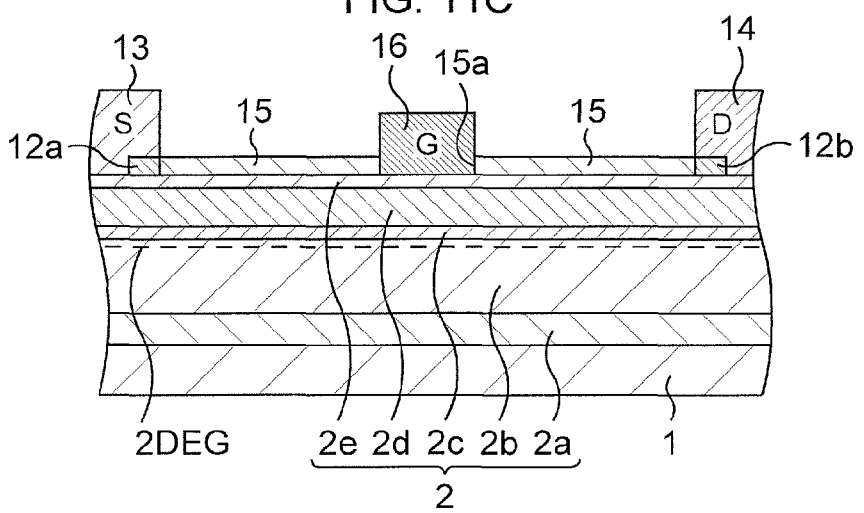

Subsequently, a gate electrode 16 is formed as illustrated in FIG. 11C.

In more detail, a resist is first applied on a surface of the protective insulating film 15. The resist is processed by lithography, whereby an opening from which a portion, of the surface of the protective insulating film 15, corresponding to a region where to form the gate electrode is exposed is formed in the resist. Consequently, a resist mask having the opening is formed.

By using this resist mask, the region where to form the gate electrode in the protective insulating film 15 is dry-etched to be removed until the surface of the cap layer 2e is exposed. Consequently, an electrode recess 15a from which the region where to form the gate electrode in the surface of the cap layer 2e is exposed is formed in the protective insulating film 15. For the dry etching, fluorine-based etching gas such as $SF_6$, for instance, is used.

The resist mask is removed by ashing using oxygen plasma or by wetting using a predetermined chemical solution.

Next, a resist is applied on the protective insulating film 15. The resist is processed by lithography, whereby an opening from which the electrode recess 15a is exposed is formed in the resist. Consequently, a resist mask having the opening is formed.

By using this resist mask, for example, Ni/Au is deposited as an electrode material on the resist mask including the inside of the opening from which the electrode recess 15a of the protective insulating film 15 is exposed, by a vapor deposition method, for instance. A thickness of Ni is about 30 nm and a thickness of Au is about 400 nm. The resist mask and Ni/Au deposited thereon are removed by a liftoff method. Consequently, the gate electrode 16 part of whose electrode material in its lower portion fills the inside of the electrode recess 15a is formed.

Thereafter, through various processes such as the formation of an interlayer insulating film, the formation of wirings connected to the source electrode 13, the drain electrode 14, and the gate electrode 16, the formation of an upper protective film, and the formation of connection electrodes exposed to the uppermost surface, the AlGaN/GaN HEMT according to this embodiment is formed.

As described above, according to this embodiment, a highly reliable and high-withstand-voltage AlGaN/GaN HEMT that enables a high-current operation by alleviating the current density of the source electrode 13 and the drain electrode 14 is realized.

Fourth Embodiment

In this embodiment, a structure and a manufacturing method of an AlGaN/GaN HEMT are disclosed as in the first embodiment, but a form of a high-resistance layer is different from that of the first embodiment. Note that the same constituent members and so on as those of the first embodiment will be denoted by the same reference signs and a detailed description thereof will be omitted.

FIG. 12A to FIG. 12C and FIG. 13A to FIG. 13C are schematic cross-sectional views illustrating main steps of the method of manufacturing the AlGaN/GaN HEMT according to the fourth embodiment.

Figure 12A:
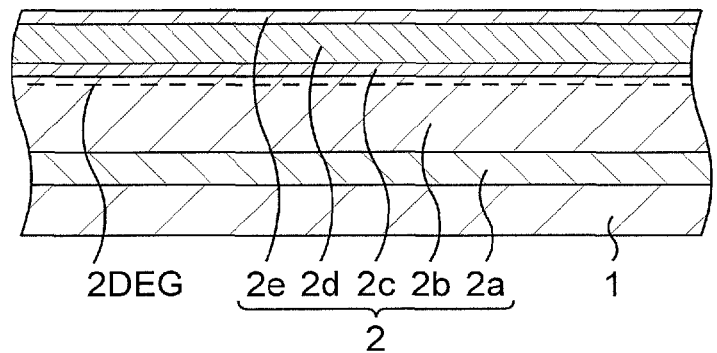
FIG. 12A to FIG. 12C are schematic cross-sectional views illustrating main steps of a method of manufacturing an AlGaN/GaN HEMT according to a fourth embodiment.

In this embodiment, the step in FIG. 1A is first performed as in the first embodiment. At this time, a compound semiconductor stacked structure 2 having a buffer layer 2a, an electron transit layer 2b, an intermediate layer 2c, an electron supply layer 2d, and a cap layer 2e is formed on a SiC substrate 1. A state at this time is illustrated in FIG. 12A.

Figure 12B:
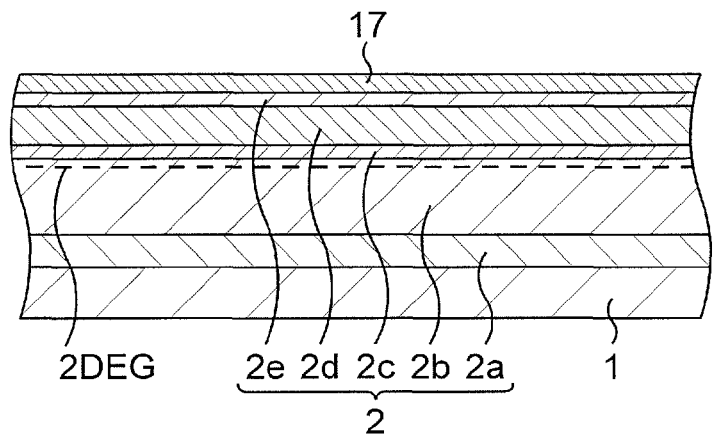

Subsequently, as illustrated in FIG. 12B, an Al—N layer 17 is formed.

In more detail, aluminum nitride (Al—N) with an about 1 nm to about 100 nm thickness, for example, an about 3 nm thickness is deposited on the compound semiconductor stacked structure 2 by a sputtering method or the like. Consequently, the Al—N layer 17 is formed.

The Al—N layer 17 is a high-resistance layer higher in an electric resistance value than a source electrode and a drain electrode which will be described later. An Al—N compound contained in the Al—N layer 17, assuming that it is an $Al_x$—$Si_y$—$N_z$ compound, is a compound that satisfies $$x+y+z=1$$

and $$0<x<1$$

and further satisfies $$y=0$$

and $$0<z<1.$$

Figure 12C:
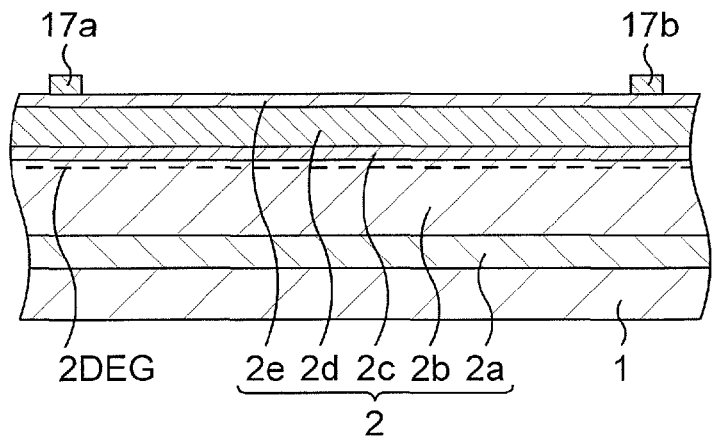

Subsequently, the Al—N layer 17 is processed as illustrated in FIG. 12C.

In more detail, a resist is applied on a surface of the Al—N layer 17. The resist is processed by lithography, whereby a resist mask covering portions, of the surface of the Al—N layer 17, corresponding to the inside of a region where to form the source electrode and the inside of a region where to form the drain electrode is formed.

By using this resist mask, the Al—N layer 17 except its portions in the planned electrode formation regions is dry-etched to be removed until a surface of the cap layer 2e is exposed. For the dry etching, fluorine-based etching gas such as $SF_6$, is used, for instance. Consequently, the Al—N layer 17 is left inside the region where to form the source electrode and the region where to form the drain electrode on the cap layer 2e. The Al—N layer 17 left in the region where to form the source electrode is referred to as an Al—N layer 17a, and the Al—N layer 17 left in the region where to form the drain electrode is referred to as an Al—N layer 17b.

The resist mask is removed by ashing using oxygen plasma or by wetting using a predetermined chemical solution.

Figure 13A:
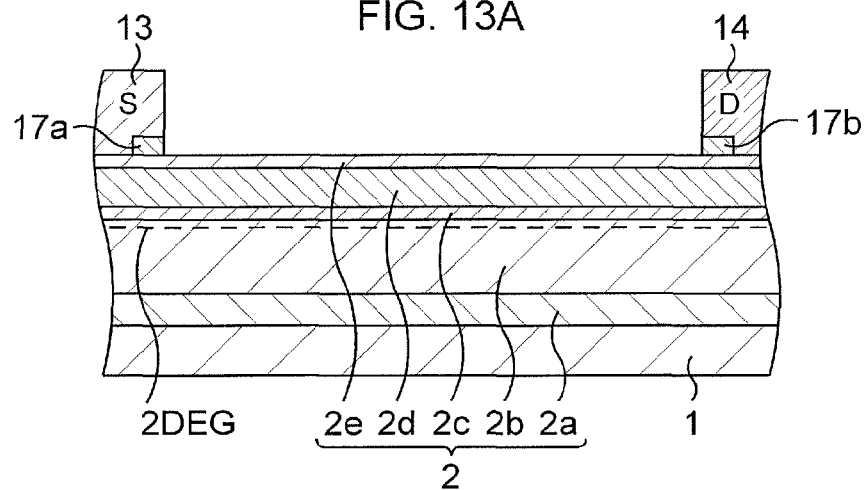
FIG. 13A to FIG. 13C, which are continued from FIG. 12A to FIG. 12C, are schematic cross-sectional views illustrating main steps of the method of manufacturing the AlGaN/GaN HEMT according to the fourth embodiment.

Subsequently, the source electrode 13 and the drain electrode 14 are formed as illustrated in FIG. 13A.

In more detail, a resist is applied on a surface of the compound semiconductor stacked structure 2. The resist is processed by lithography, whereby openings from which regions including the Al—N layers 17a, 17b are exposed are formed in the resist. Consequently, a resist mask having the openings is formed.

By using this resist mask, a conductive material containing Al, for example, Ti/Al is deposited as an electrode material on the resist mask including the inside of the openings from which the regions including the Al—N layers 17a, 17b are exposed, by, for example, a vapor deposition method. A thickness of Ti is about 30 nm and a thickness of Al is about 200 nm. The resist mask and Ti/Al deposited thereon are removed by a liftoff method. Consequently, the source electrode 13 including the Al—N layer 17a in its lower portion and the drain electrode 14 including the Al—N layer 17b in its lower portion are formed on the compound semiconductor stacked structure 2. In the source electrode 13 and the drain electrode 14, the Al—N layers 17a, 17b are locally provided in respective electrode ends so that ends of the Al—N layers 17a, 17b are exposed from side surfaces facing each other of the source electrode 13 and the drain electrode 14. The Al—N layers 17a, 17b are high-resistance layers higher in an electric resistance value than the source electrode 13 and the drain electrode 14.

Subsequently, the SiC substrate 1 is heat-treated in, for example, a nitrogen atmosphere at a temperature of about 400° C. to about 1000° C., for example, about 550° C. Consequently, Ti/Al of the source electrode 13 and the drain electrode 14 is in ohmic contact with the cap layer 2e, so that an ohmic characteristic is established.

Figure 13B:
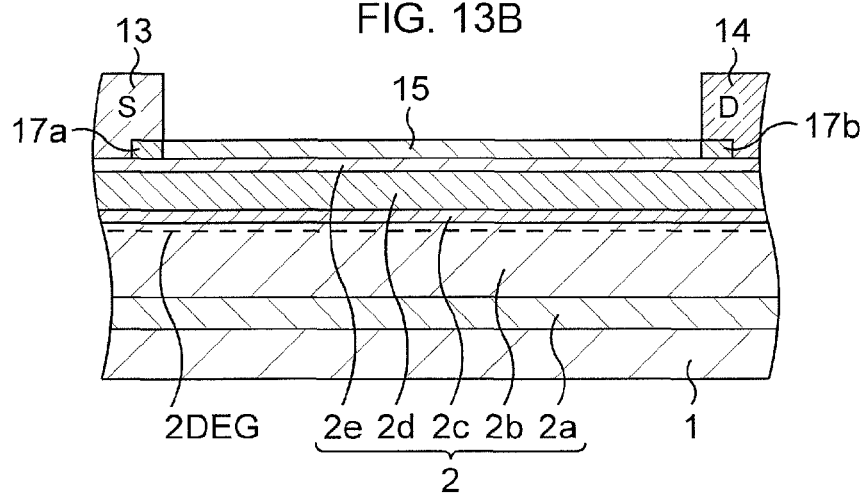

Subsequently, as illustrated in FIG. 13B, a protective insulating film 15 is formed on a region between the source electrode 13 and the drain electrode 14.

In more detail, SiN with an about 10 nm to about 5000 nm thickness, for example, an about 100 nm thickness is deposited on the compound semiconductor stacked structure 2 by a plasma CVD method, a sputtering method, or the like. SiN deposited on the source electrode 13 and the drain electrode 14 is removed by lithography, dry etching, and so on. A resist mask used for the lithography is removed by ashing using oxygen plasma or by wetting using a predetermined chemical solution. Consequently, on the compound semiconductor stacked structure 2, the protective insulating film 15 is formed on the region between the source electrode 13 and the drain electrode 14.

Figure 13C:
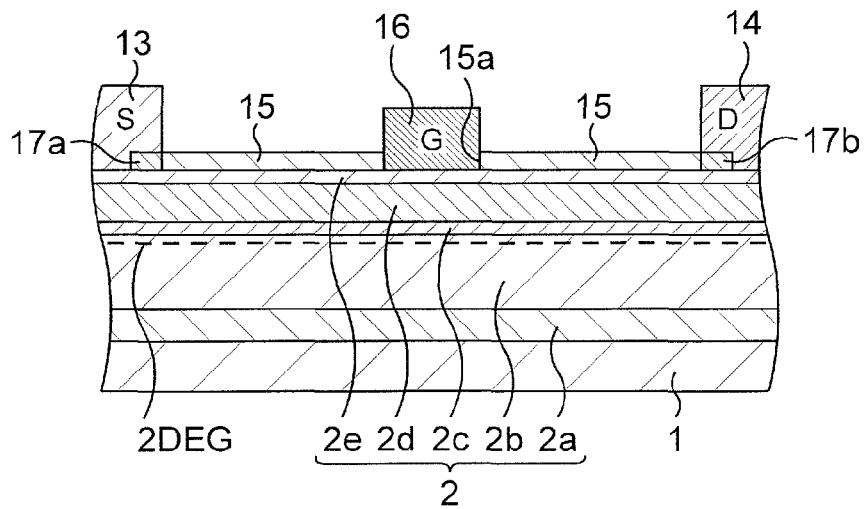

Subsequently, a gate electrode 16 is formed as illustrated in FIG. 13C.

In more detail, a resist is first applied on a surface of the protective insulating film 15. The resist is processed by lithography, whereby an opening from which a portion, of the surface of the protective insulating film 15, corresponding to a region where to form the gate electrode is exposed is formed in the resist. Consequently, a resist mask having the opening is formed.

By using this resist mask, the region where to form the gate electrode in the protective insulating film 15 is dry-etched to be removed until the surface of the cap layer 2e is exposed. Consequently, an electrode recess 15a from which the region where to form the gate electrode in the surface of the cap layer 2e is exposed is formed in the protective insulating film 15. For the dry etching, fluorine-based etching gas such as $SF_6$ is used, for instance.

The resist mask is removed by ashing using oxygen plasma or by wetting using a predetermined chemical solution.

Next, a resist is applied on the protective insulating film 15. The resist is processed by lithography, whereby an opening from which the electrode recess 15a is exposed is formed in the resist. Consequently, a resist mask having the opening is formed.

By using this resist mask, for example, Ni/Au is deposited as an electrode material on the resist mask including the inside of the opening from which the electrode recess 15a of the protective insulating film 15 is exposed, by a vapor deposition method, for instance. A thickness of Ni is about 30 nm and a thickness of Au is about 400 nm. The resist mask and Ni/Au deposited thereon are removed by a liftoff method. Consequently, the gate electrode 16 part of whose electrode material in its lower portion fills the inside of the electrode recess 15a is formed.

Thereafter, through various processes such as the formation of an interlayer insulating film, the formation of wirings connected to the source electrode 13, the drain electrode 14, and the gate electrode 16, the formation of an upper protective film, and the formation of connection electrodes exposed to the uppermost surface, the AlGaN/GaN HEMT according to this embodiment is formed.

As described above, according to this embodiment, a highly reliable and high-withstand-voltage AlGaN/GaN HEMT that enables a high-current operation by alleviating the current density of the source electrode 13 and the drain electrode 14 is realized.

Fifth Embodiment

In this embodiment, a power supply circuit to which one kind of the AlGaN/GaN HEMT selected from the first to fourth embodiments is applied is disclosed.

Figure 14:
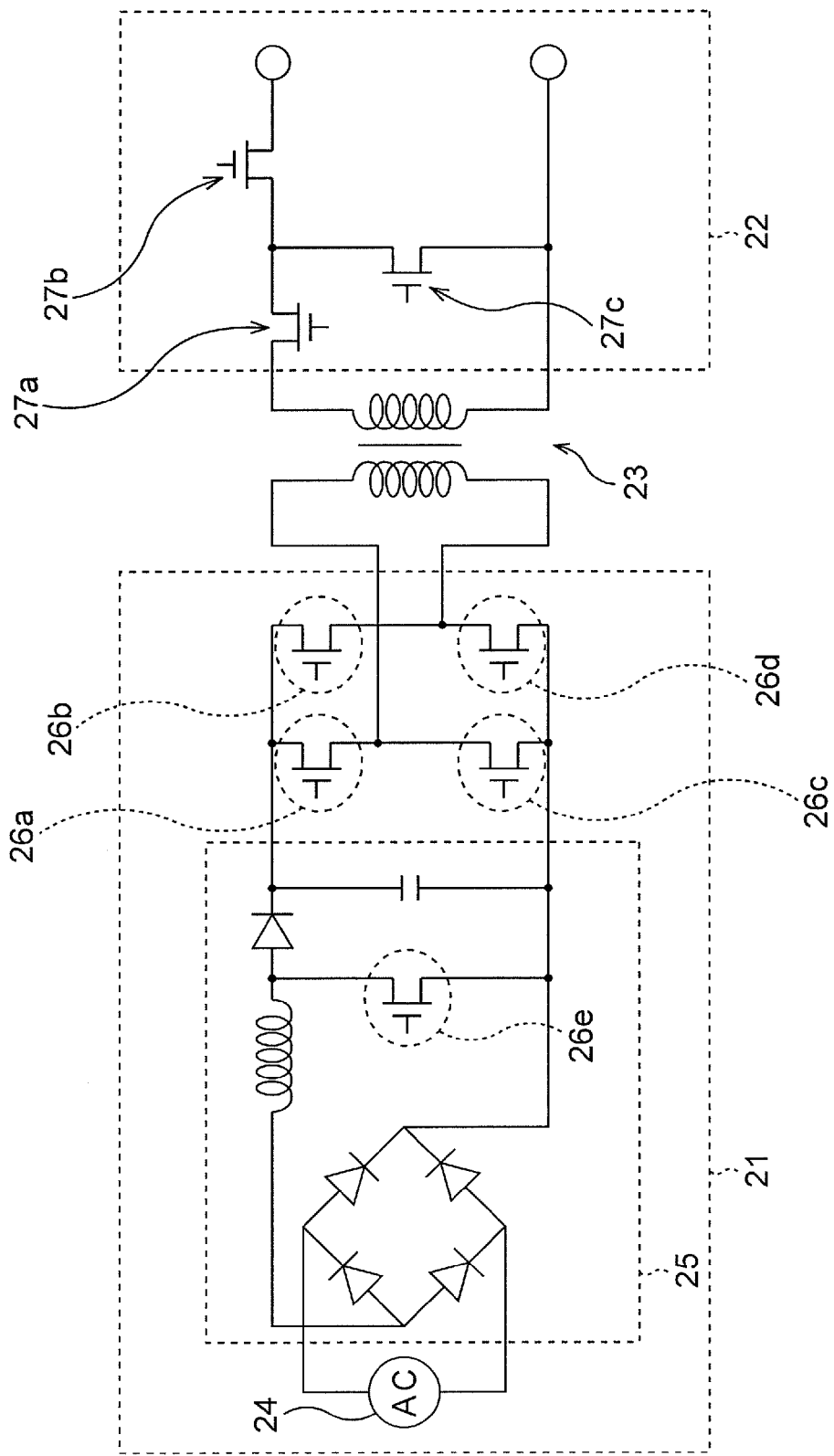
FIG. 14 is a connection diagram illustrating a schematic structure of a power supply circuit according to a fifth embodiment.

FIG. 14 is a connection diagram illustrating a schematic structure of the power supply circuit according to the fifth embodiment.

The power supply circuit according to this embodiment includes a high-voltage primary-side circuit 21, a low-voltage secondary-side circuit 22, and a transformer 23 disposed between the primary-side circuit 21 and the secondary-side circuit 22.

The primary-side circuit 21 includes an AC power source 24, a so-called bridge rectifying circuit 25, and a plurality of (four here) switching elements 26a, 26b, 26c, 26d. Further, the bridge rectifying circuit 25 has a switching element 26e.

The secondary-side circuit 22 includes a plurality of (three here) switching elements 27a, 27b, 27c.

In this embodiment, the switching elements 26a, 26b, 26c, 26d, 26e of the primary-side circuit 21 are each one kind of the AlGaN/GaN HEMT selected from the first to fourth embodiments. On the other hand, the switching elements 27a, 27b, 27c of the secondary-side circuit 22 are each an ordinary MIS FET using silicon.

In this embodiment, a highly reliable and high-withstand-voltage AlGaN/GaN HEMT that enables a high-current operation by alleviating the current density of a source electrode and a drain electrode is applied to a power supply circuit. Consequently, a highly reliable and high-power power supply circuit is realized.

Sixth Embodiment

In this embodiment, a high-frequency amplifier to which one kind of the AlGaN/GaN HEMT selected from the first to fourth embodiments is applied is disclosed.

Figure 15:
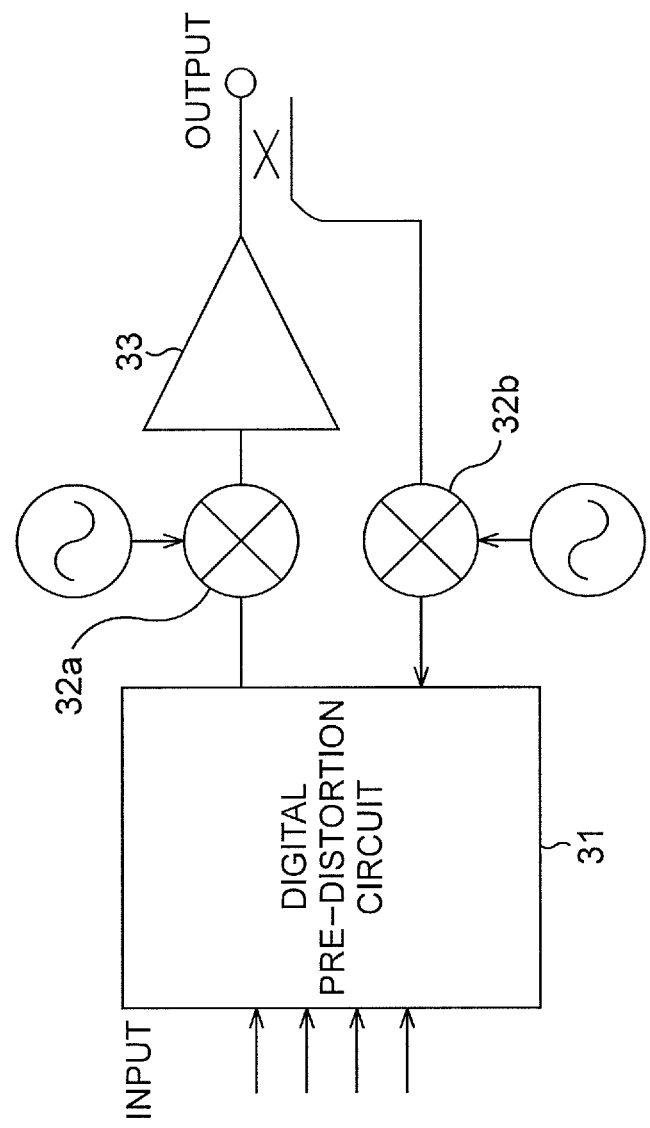
FIG. 15 is a connection diagram illustrating a schematic structure of a high-frequency amplifier according to a sixth embodiment.

FIG. 15 is a connection diagram illustrating a schematic structure of the high-frequency amplifier according to the sixth embodiment.

The high-frequency amplifier according to this embodiment includes a digital pre-distortion circuit 31, mixers 32a, 32b, and a power amplifier 33.

The digital pre-distortion circuit 31 compensates nonlinear distortion of an input signal. The mixer 32a mixes the input signal whose nonlinear distortion is compensated and an AC signal. The power amplifier 33 amplifies the input signal mixed with the AC signal, and has one kind of the AlGaN/GaN HEMT selected from the first to fourth embodiments. In FIG. 15, by, for example, changing of the switches, an output-side signal can be mixed with the AC signal by the mixer 32b, and the resultant can be sent out to the digital pre-distortion circuit 31.

In this embodiment, a highly reliable and high-withstand-voltage AlGaN/GaN HEMT that enables a high-current operation by alleviating the current density of a source electrode and a drain electrode is applied to the high-frequency amplifier. Consequently, a highly reliable and high-withstand-voltage high-frequency amplifier is realized.

Other Embodiments

In the first to sixth embodiments, the AlGaN/GaN HEMT is exemplified as the compound semiconductor device. As the compound semiconductor device, the present invention is applicable to the following HEMTs, besides the AlGaN/GaN HEMT.

Example 1 of Other HEMT

In this example, an InAlN/GaN HEMT is disclosed as the compound semiconductor device.

InAlN and GaN are compound semiconductors whose lattice constants can be made close to each other by the composition. In this case, in the above-described first to sixth embodiments, the electron transit layer is made of i-GaN, the intermediate layer is made of i-InAlN, the electron supply layer is made of n-InAlN, and the cap layer is made of n-GaN. Further, in this case, almost no piezoelectric polarization occurs, and therefore, two-dimensional electron gas is generated mainly by spontaneous polarization of InAlN.

According to this example, a highly reliable and high-withstand voltage InAlN/GaN HEMT that enables a high-current operation by alleviating a current density of a source electrode and a drain electrode is realized, similarly to the above-described AlGaN/GaN HEMT.

Example 2 of Other HEMT

In this example, an InAlGaN/GaN HEMT is disclosed as the compound semiconductor device.

GaN and InAlGaN are compound semiconductors, with the latter capable of having a smaller lattice constant than that of the former by the composition. In this case, in the above-described first to sixth embodiments, the electron transit layer is made of i-GaN, the intermediate layer is made of i-InAlGaN, the electron supply layer is made of n-InAlGaN, and the cap layer is made of n-GaN.

According to this example, a highly reliable and high-withstand-voltage InAlGaN/GaN HEMT that enables a high-current operation by alleviating a current density of a source electrode and a drain electrode is realized, similarly to the above-described AlGaN/GaN HEMT.

According to the above-described various embodiments, a highly reliable and high-withstand-voltage compound semiconductor device that enables a high-current operation by alleviating a current density of an electrode is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor layer;
a first electrode and a second electrode formed on an upper side of the compound semiconductor layer; and
a high-resistance layer disposed in a lower portion of the first electrode and higher in an electric resistance value than other portions of the first electrode; wherein
the high-resistance layer has a portion containing 80% Al or more.

2. A compound semiconductor device comprising:
a compound semiconductor layer;
a first electrode and a second electrode formed on an upper side of the compound semiconductor layer; and
a high-resistance layer disposed in a lower portion of the first electrode and higher in an electric resistance value than the other portions of the first electrode; wherein
in the high-resistance layer, an Al content ratio gradually decreases from a value equal to or higher than 80% from an electrode end distant from the second electrode toward an electrode end close to the second electrode.

3. A method of manufacturing a compound semiconductor device comprising:
forming a compound semiconductor layer; and
forming a first electrode and a second electrode on an upper side of the compound semiconductor layer; wherein
a high-resistance layer higher in an electric resistance value than the other portions of the first electrode is formed in a lower portion of the first electrode; and
the high-resistance layer has a portion containing 80% Al or more.

4. A method of manufacturing a compound semiconductor device comprising:
forming a compound semiconductor layer; and
forming a first electrode and a second electrode on an upper side of the compound semiconductor layer; wherein
a high-resistance layer higher in an electric resistance value than the other portions of the first electrode is formed in a lower portion of the first electrode; and
in the high-resistance layer, an Al content ratio gradually decreases from a value equal to or higher than 80% from an electrode end distant from the second electrode toward an electrode end close to the second electrode.

5. A power supply circuit comprising:
a transformer; and
a high-voltage circuit and a low-voltage circuit sandwiching the transformer, the high-voltage circuit comprising a transistor, the transistor comprising:
a compound semiconductor layer;
a first electrode and a second electrode formed on an upper side of the compound semiconductor layer; and
a high-resistance layer disposed in a lower portion of the first electrode and higher in an electric resistance value than the other portions of the first electrode; wherein
the high-resistance layer has a portion containing 80% Al or more.

6. The compound semiconductor device according to claim 1, wherein the high-resistance layer contains an $Al_x$—$Si_y$—$N_z$ compound that satisfies $$x+y+z=1$$

and $$0<x<1.$$

7. The compound semiconductor device according to claim 1, the first electrode having a first electrode end and a second electrode end, the first electrode end being closer to the second electrode than the second electrode end, wherein the high-resistance layer is locally provided in the first electrode end.

8. The method of manufacturing the compound semiconductor device according to claim 3, wherein the high-resistance layer contains an $Al_x$—$Si_y$—$N_z$ compound that satisfies $$x+y+z=1$$

and $$0<x<1.$$

9. The method of manufacturing the compound semiconductor device according to claim 3, the first electrode having a first electrode end and a second electrode end, the first electrode end being closer to the second electrode than the second electrode end, wherein the high-resistance layer is locally provided in the first electrode end.

10. The power supply circuit of claim 5, wherein in the high-resistance layer, an Al content ratio gradually decreases from a value equal to or higher than 80% from an electrode end distant from the second electrode toward an electrode end close to the second electrode.

11. The power supply circuit of claim 10, wherein the compound semiconductor layer comprises a material layer selected from the group consisting of AlN, AlGaN, and GaN.

12. The power supply circuit of claim 10, wherein the high-resistance layer contains an $Al_x$—$Si_y$—$N_z$ compound that satisfies $$x+y+z=1$$

and $$0<x<1.$$

13. The power supply circuit of claim 10, the first electrode having a first electrode end and a second electrode end, the first electrode end being closer to the second electrode than the second electrode end, wherein the high-resistance layer is locally provided in the first electrode end.

14. The compound semiconductor device according to claim 1, wherein the compound semiconductor layer comprises a material layer selected from the group consisting of AlN, AlGaN, and GaN.

15. The compound semiconductor device according to claim 2, wherein the compound semiconductor layer comprises a material layer selected from the group consisting of AlN, AlGaN, and GaN.

16. The compound semiconductor device according to claim 2, wherein the high-resistance layer contains an $Al_x$—$Si_y$—$N_z$ compound that satisfies $$x+y+z=1$$

and $$0<x<1.$$

17. The compound semiconductor device according to claim 2, the first electrode having a first electrode end and a second electrode end, the first electrode end being closer to the second electrode than the second electrode end, wherein the high-resistance layer is locally provided in the first electrode end.

18. The method of manufacturing the compound semiconductor device according to claim 3, wherein the compound semiconductor layer comprises a material layer selected from the group consisting of AlN, AlGaN, and GaN.

19. The method of manufacturing the compound semiconductor device according to claim 4, wherein the compound semiconductor layer comprises a material layer selected from the group consisting of AlN, AlGaN, and GaN.

20. The method of manufacturing the compound semiconductor device according to claim 4, wherein the high-resistance layer contains an $Al_x$—$Si_y$—$N_z$ compound that satisfies $$x+y+z=1$$

and $$0<x<1.$$

21. The method of manufacturing the compound semiconductor device according to claim 4, the first electrode having a first electrode end and a second electrode end, the first electrode end being closer to the second electrode than the second electrode end, wherein the high-resistance layer is locally provided in the first electrode end.

* * * * *